United States Patent [19]
Yasuda

[11] Patent Number: 5,872,532
[45] Date of Patent: Feb. 16, 1999

[54] SELECTION APPARATUS

[75] Inventor: Akira Yasuda, Kawasaki, Japan

[73] Assignee: Kabushiki Kaisha Toshiba, Kawasaki, Japan

[21] Appl. No.: 773,899

[22] Filed: Dec. 27, 1996

Related U.S. Application Data

[63] Continuation-in-part of Ser. No. 536,278, Sep. 29, 1995, abandoned.

[30]  Foreign Application Priority Data

Sep. 30, 1994 [JP] Japan .................................. 6-261281
Dec. 28, 1995 [JP] Japan .................................. 7-352203

[51] Int. Cl.$^6$ ................................................. H03M 1/66
[52] U.S. Cl. ........................................... 341/143; 341/144
[58] Field of Search .......................... 341/143, 77, 150, 341/144, 155, 172

[56]  References Cited

U.S. PATENT DOCUMENTS 5,351,050  9/1994  Thompson et al. ...................... 341/143
5,552,785  9/1996  Wilson et al. .......................... 341/143

*Primary Examiner*—Brian Young
*Attorney, Agent, or Firm*—Oblon, Spivak, McClelland, Maier & Neustadt, P.C.

[57]  ABSTRACT

A selection device including an integrator that integrates data representing a state in which each of current cells having relative error between them is used during a predetermined period. Also included is a selector that, on the basis of the integration result of the integrator, selects a control object with a smaller number of uses according to an input signal.

16 Claims, 20 Drawing Sheets

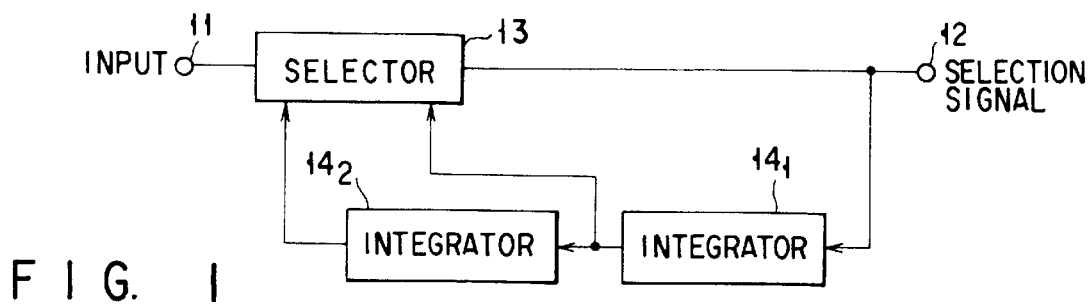
F I G. 1
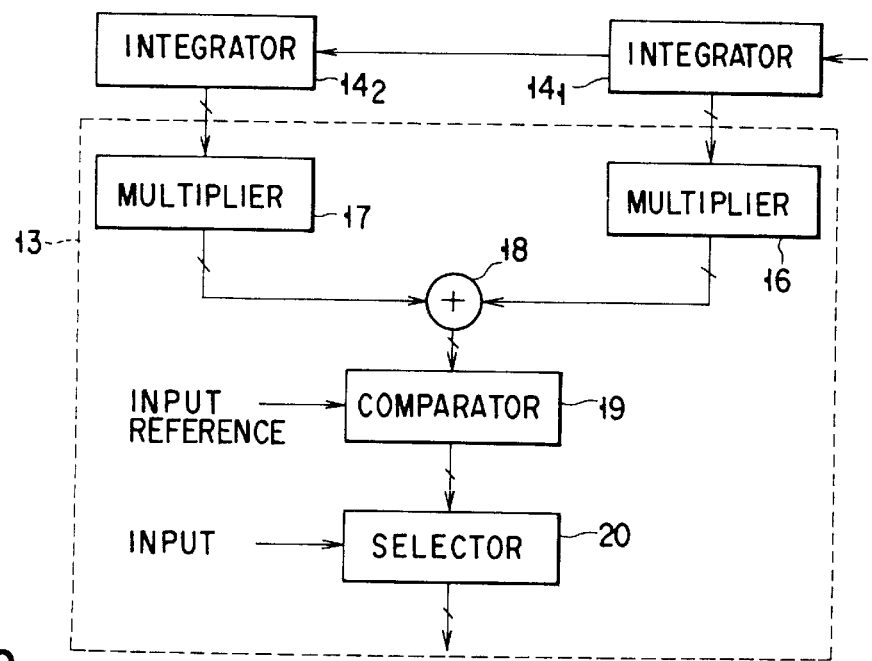
F I G. 2
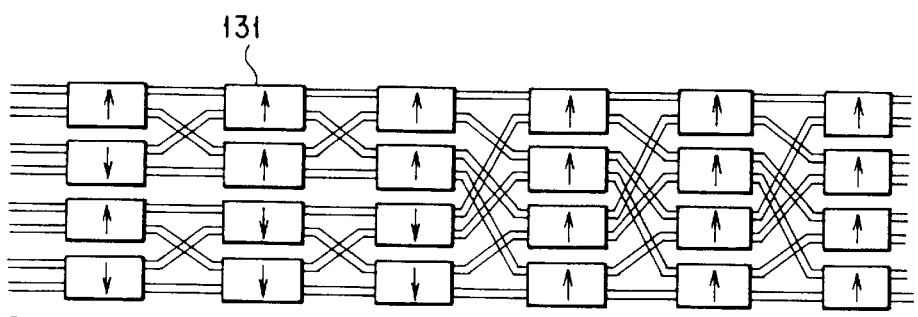
F I G. 3

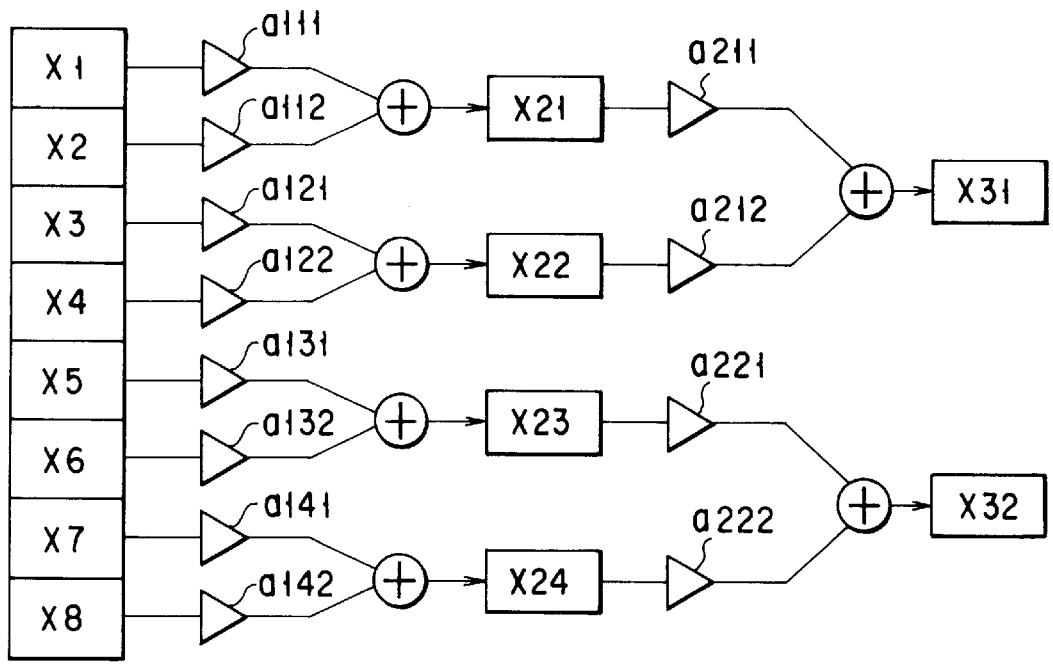
F I G. 12
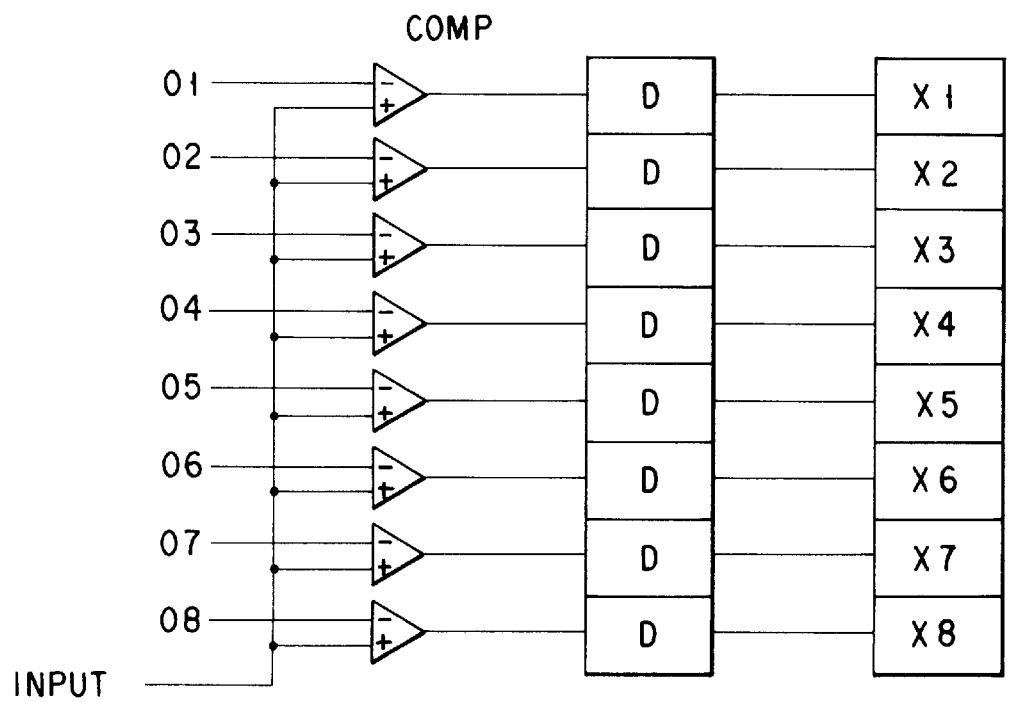
F I G. 13

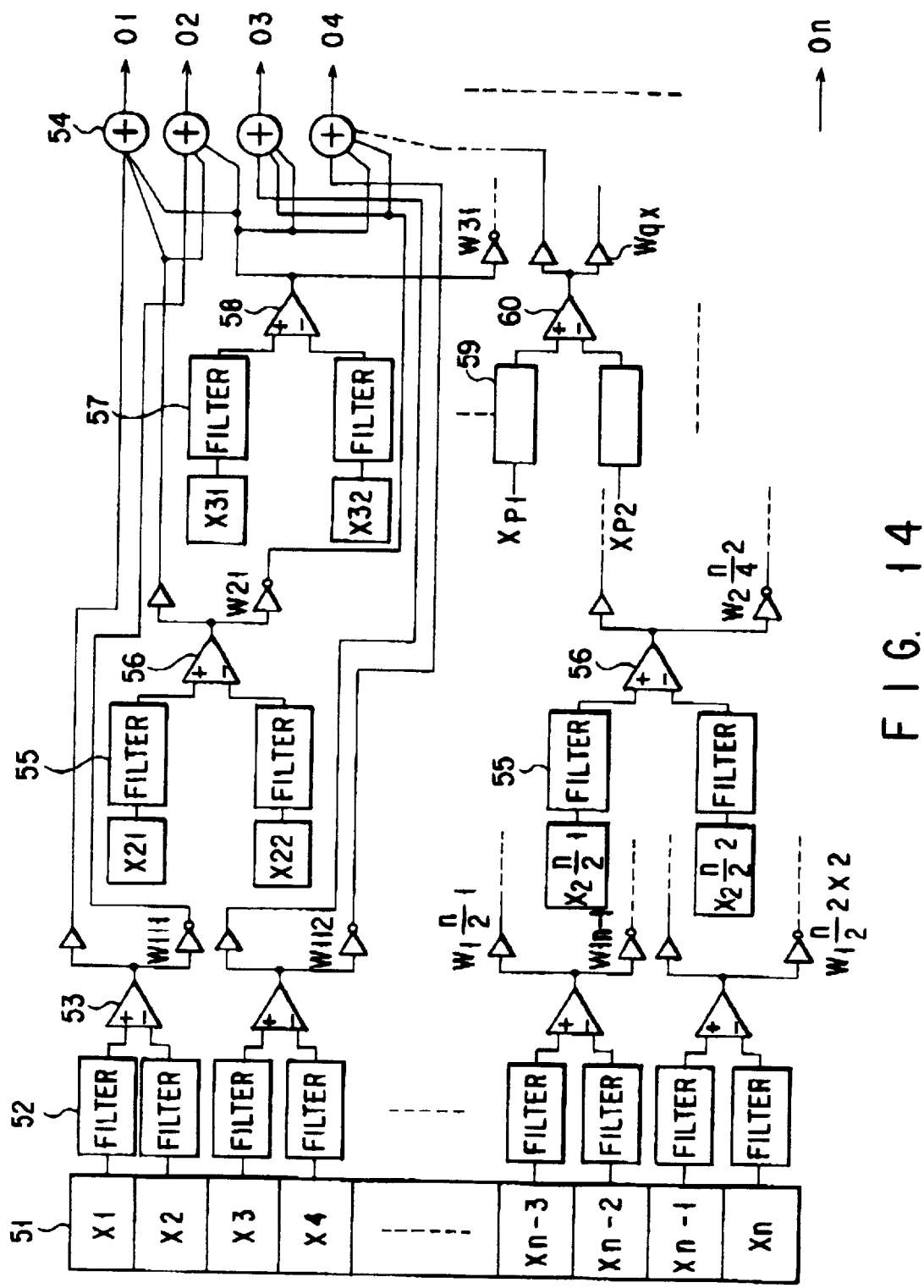
F I G. 14

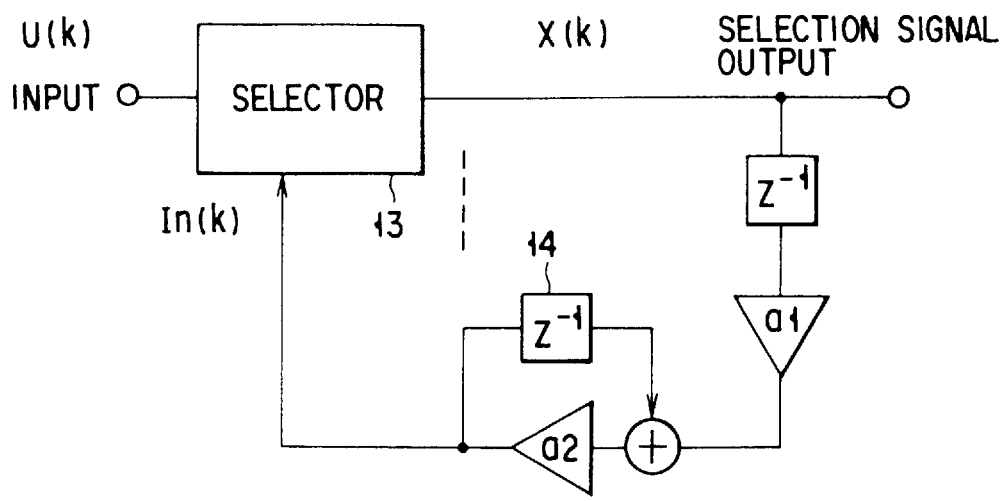
F I G. 17
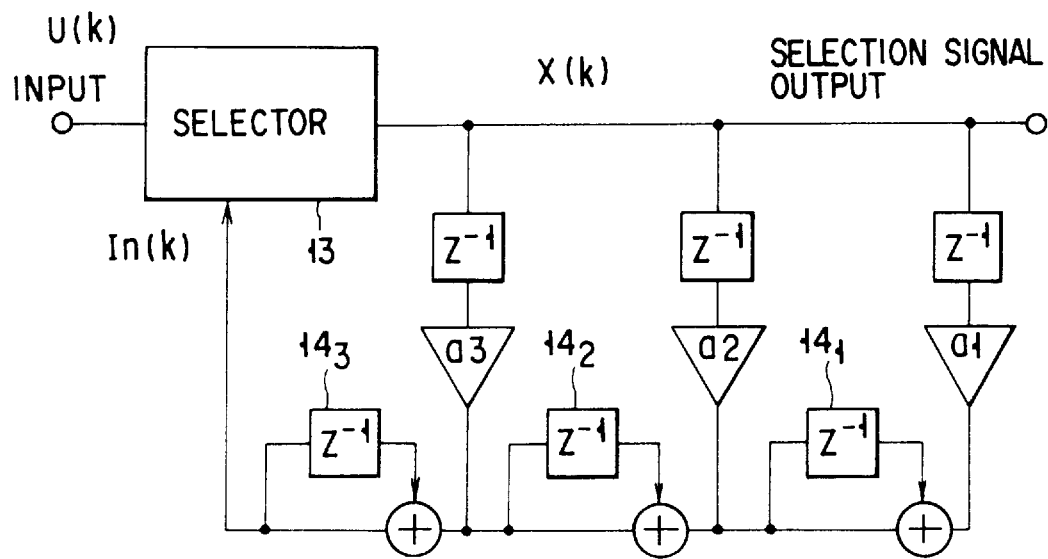
F I G. 18

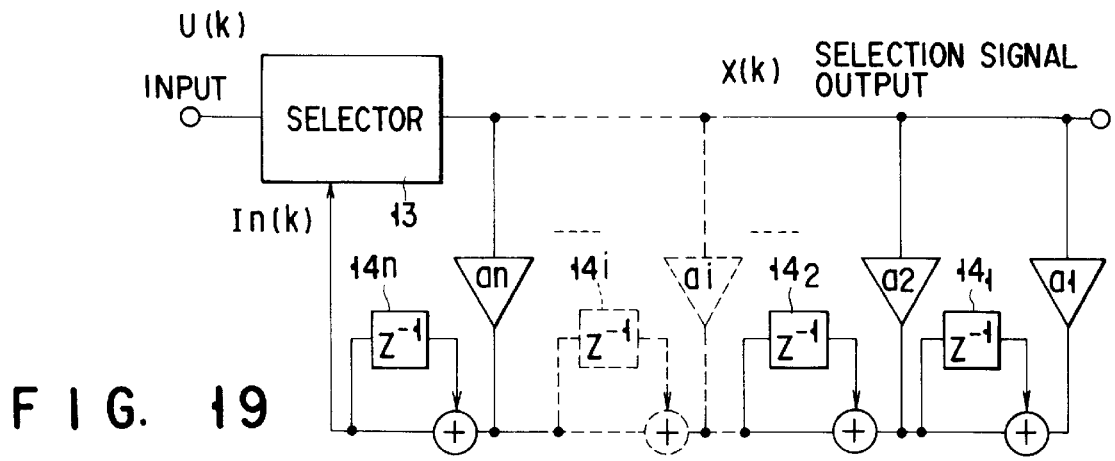
F I G. 19
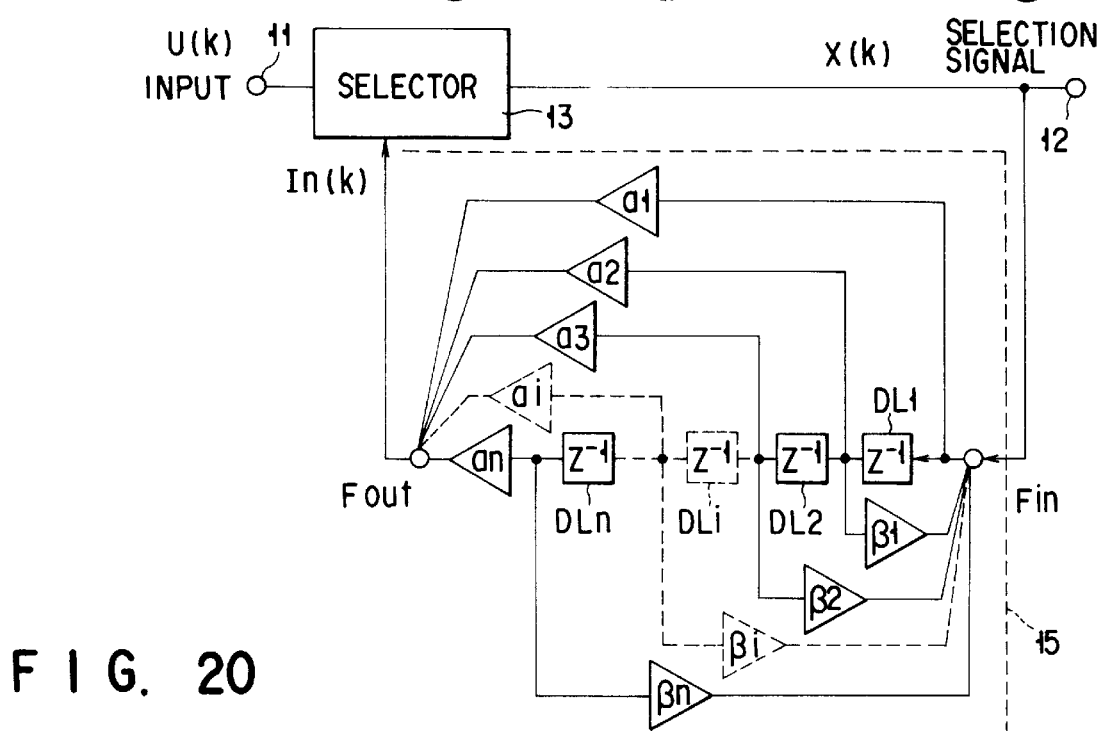
F I G. 20
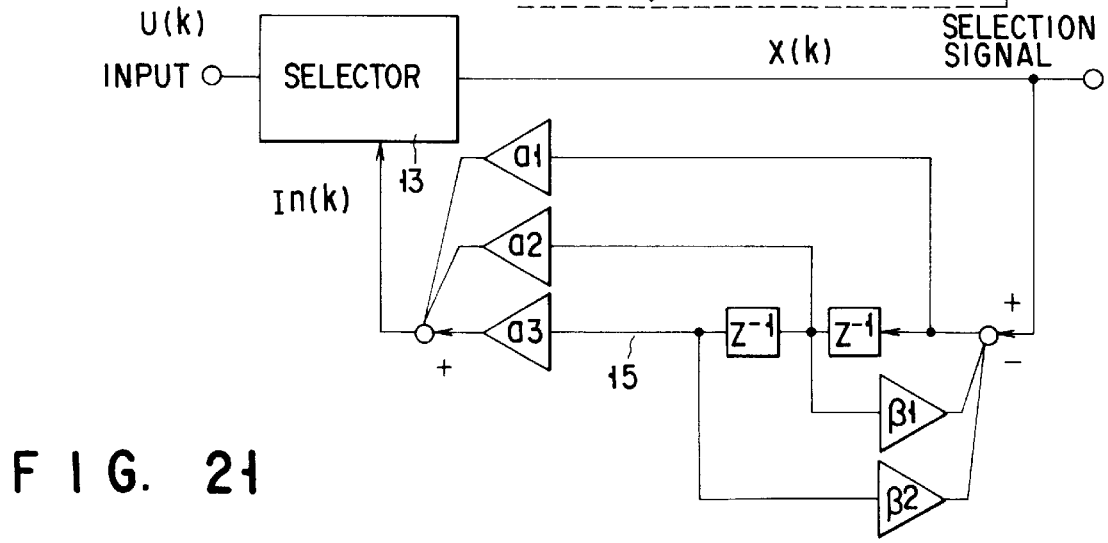
F I G. 21

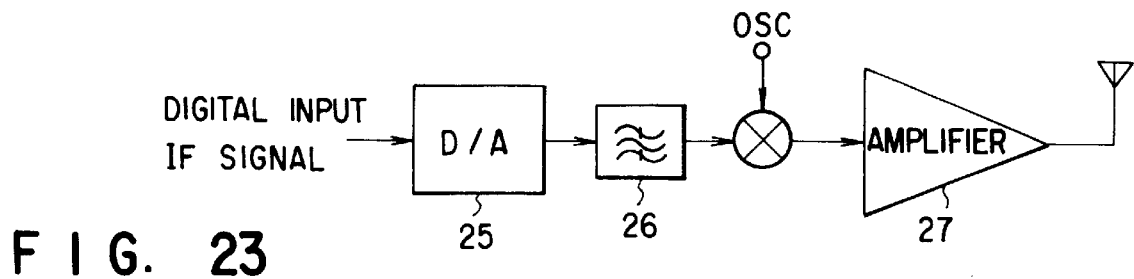
F I G. 23
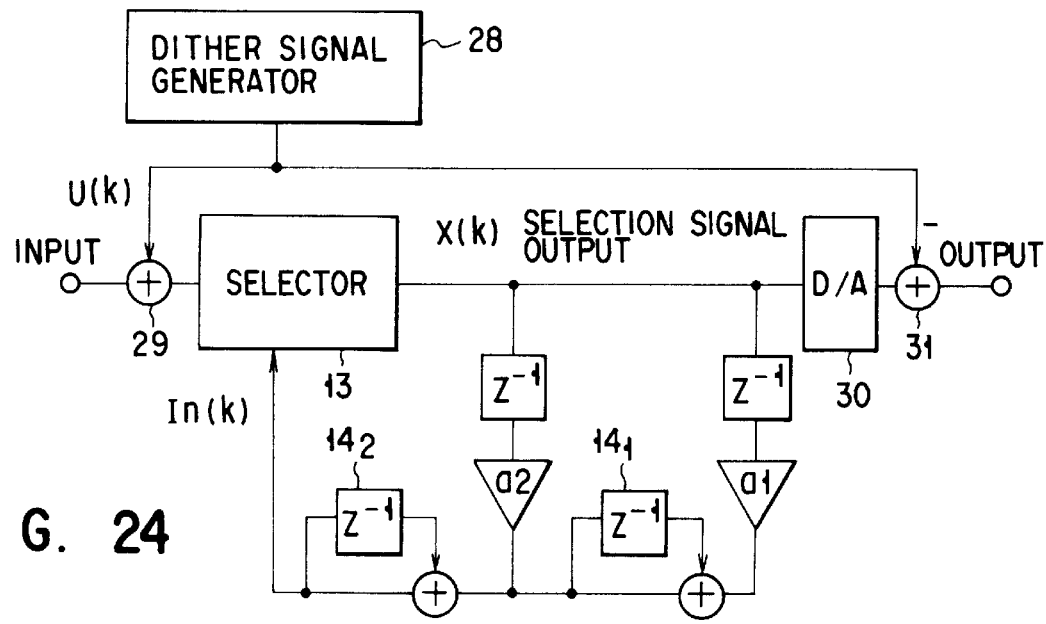
F I G. 24
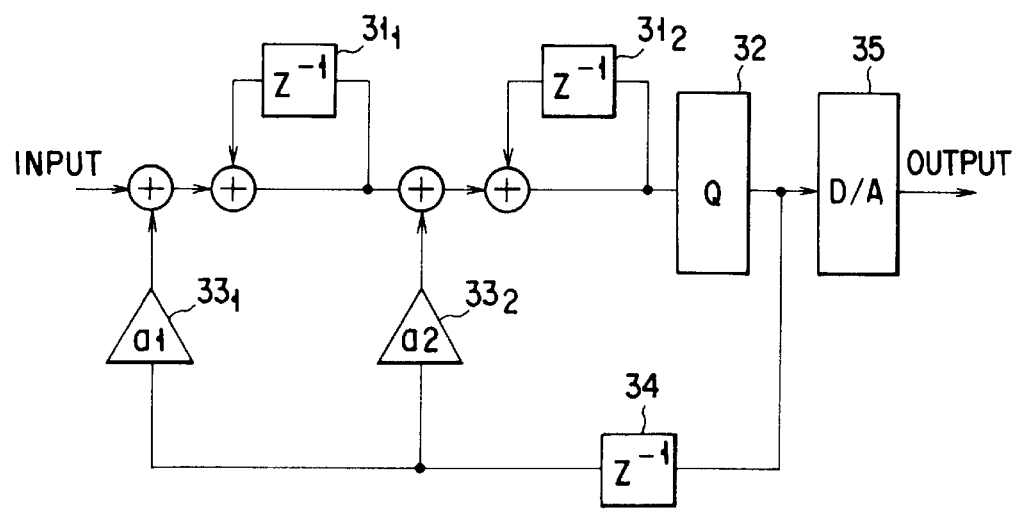
F I G. 25

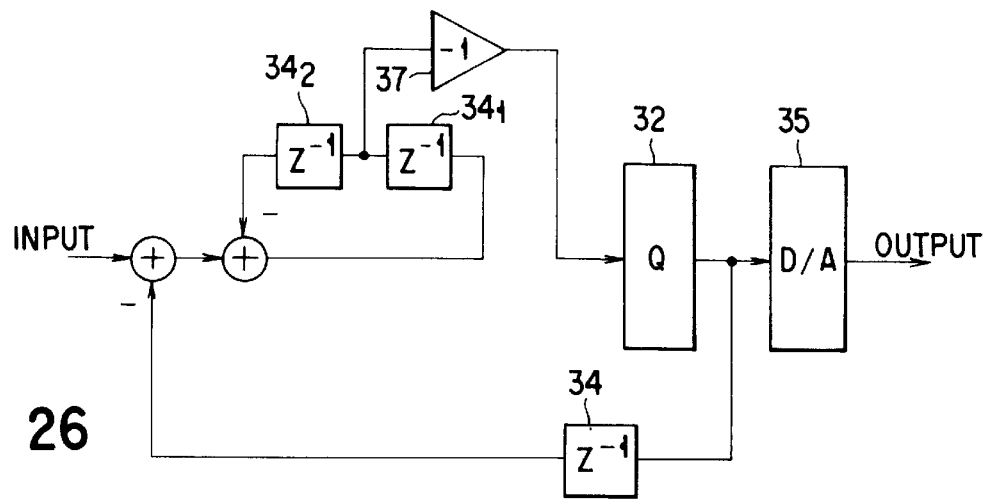
F I G. 26
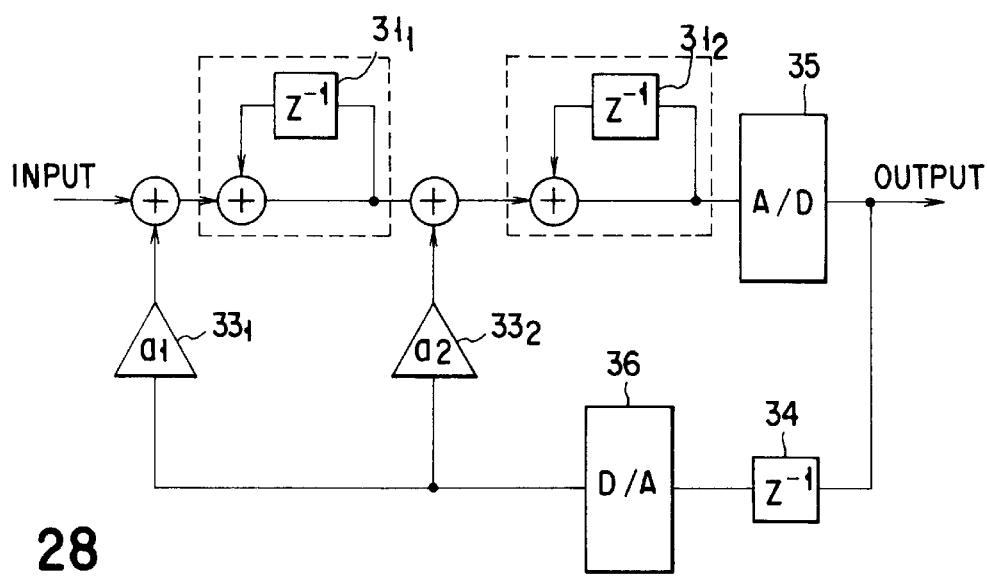
F I G. 28
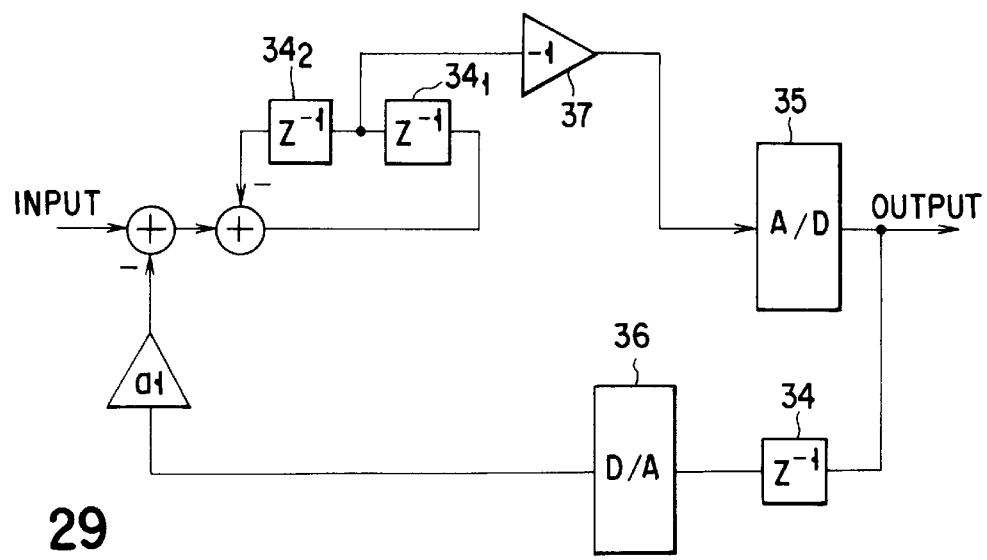
F I G. 29

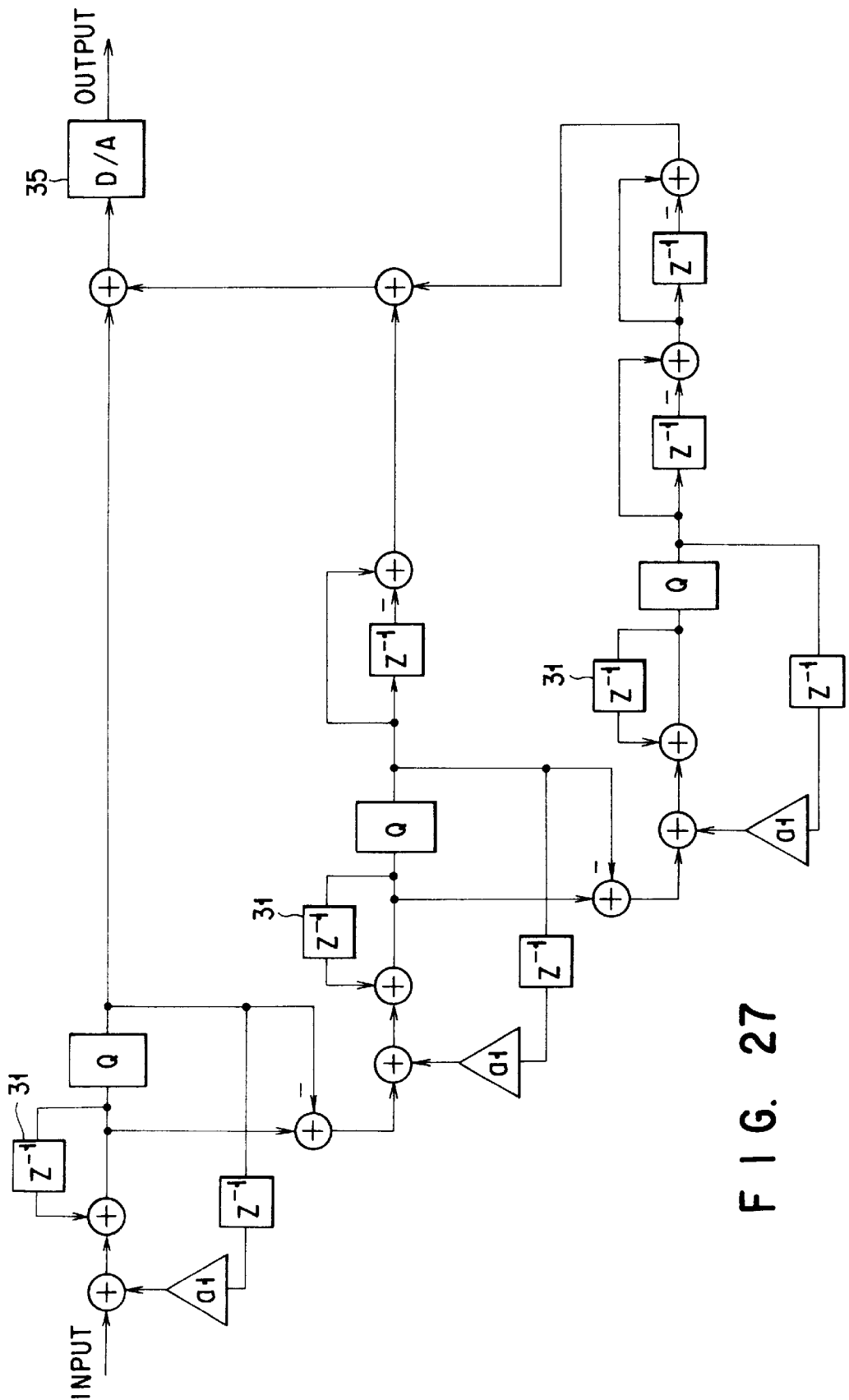
F I G. 27

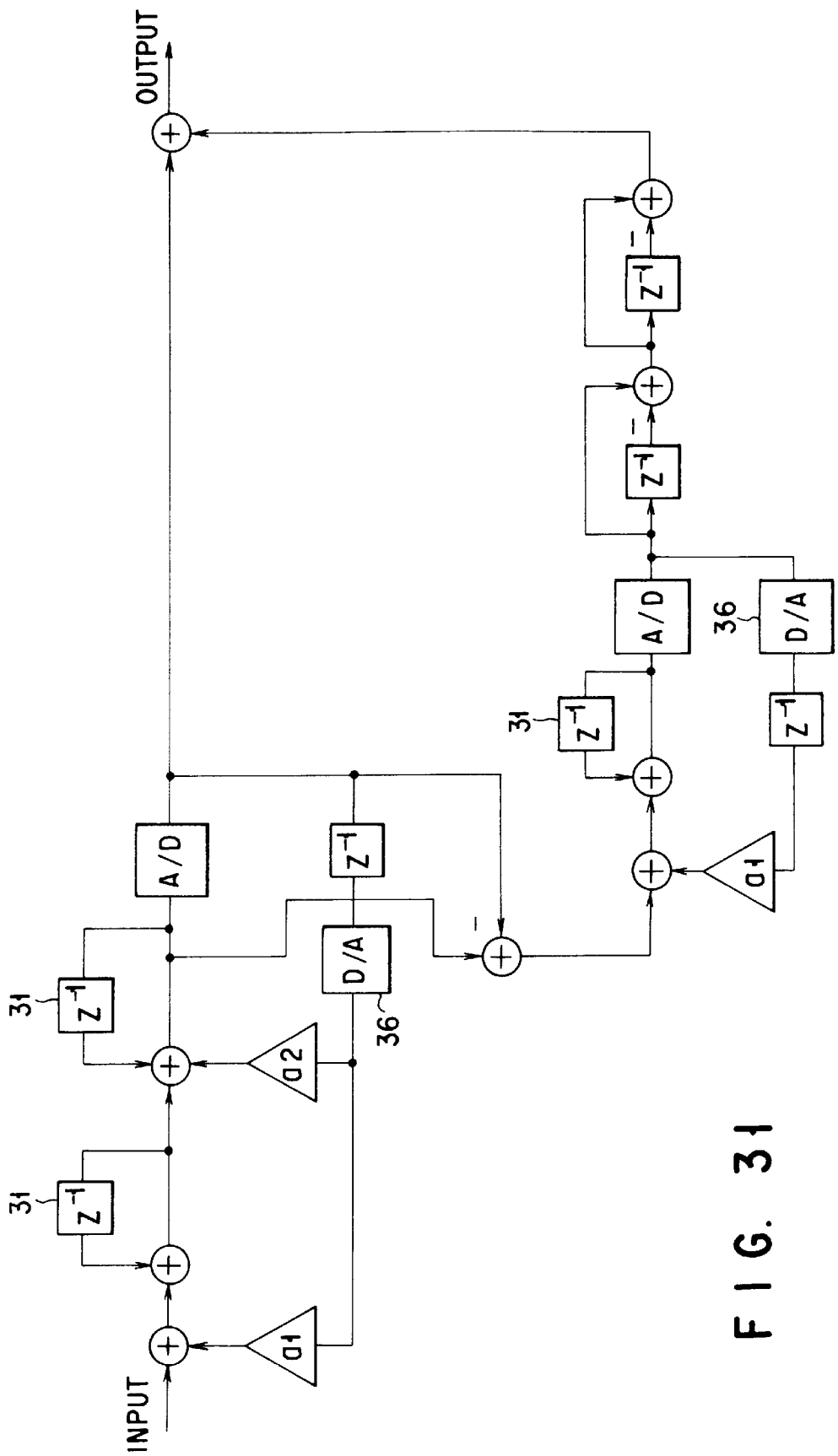
F I G. 31

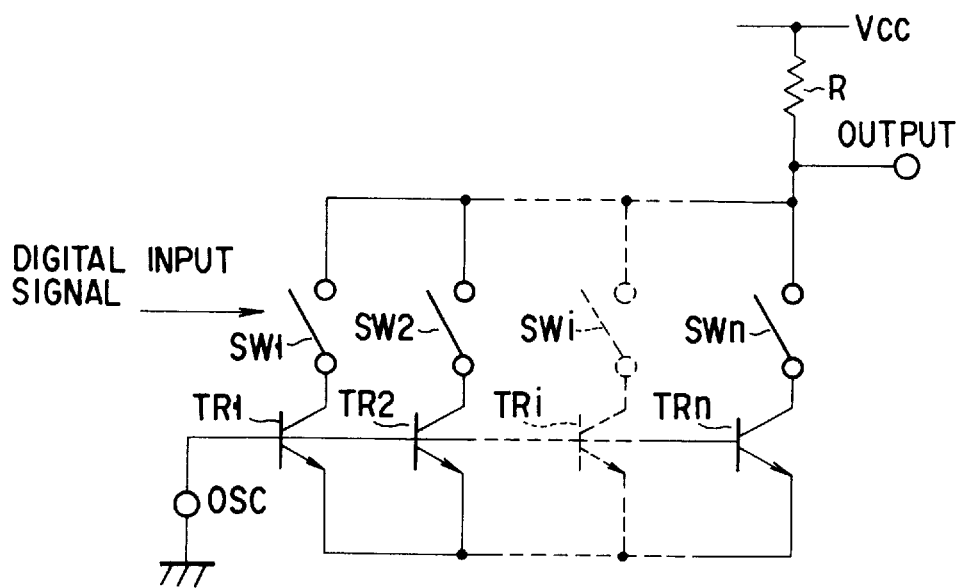
F I G. 32
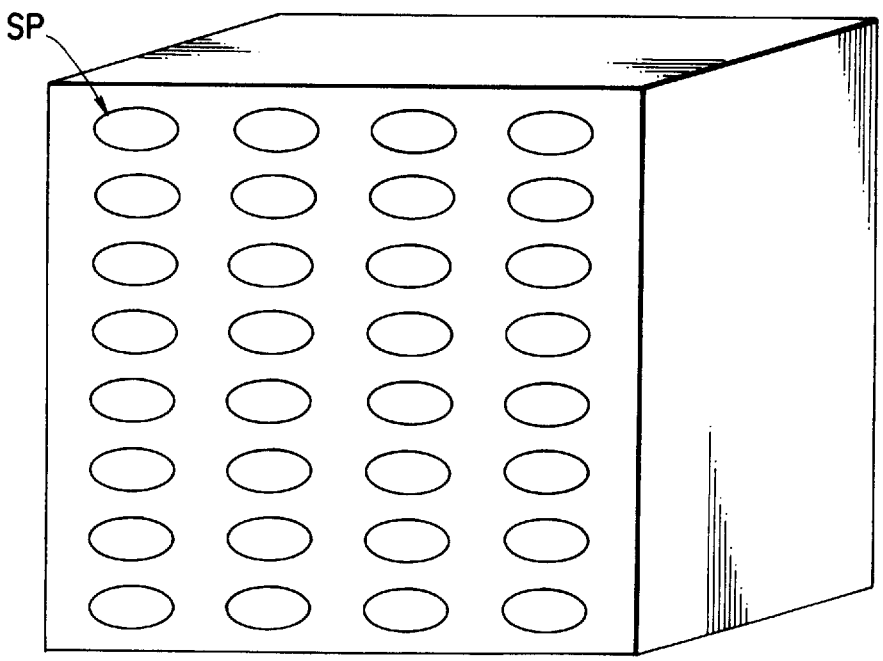
F I G. 33

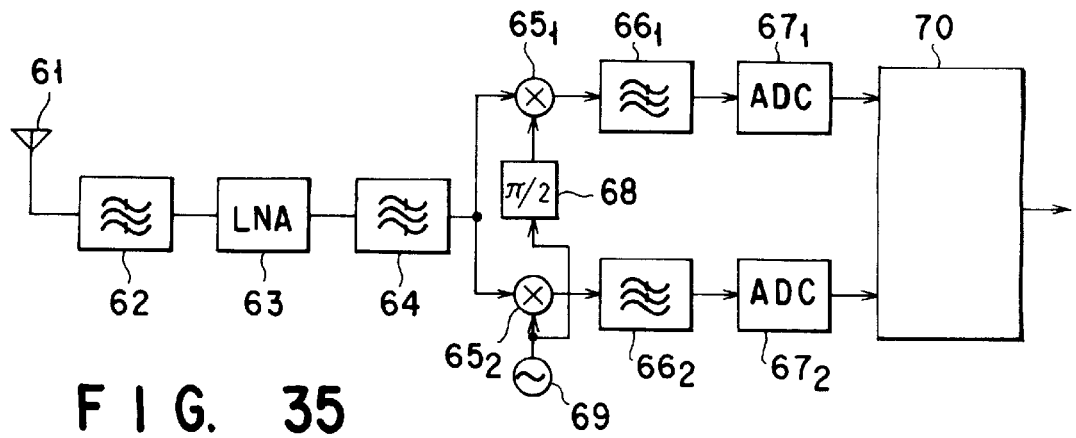
F I G. 35
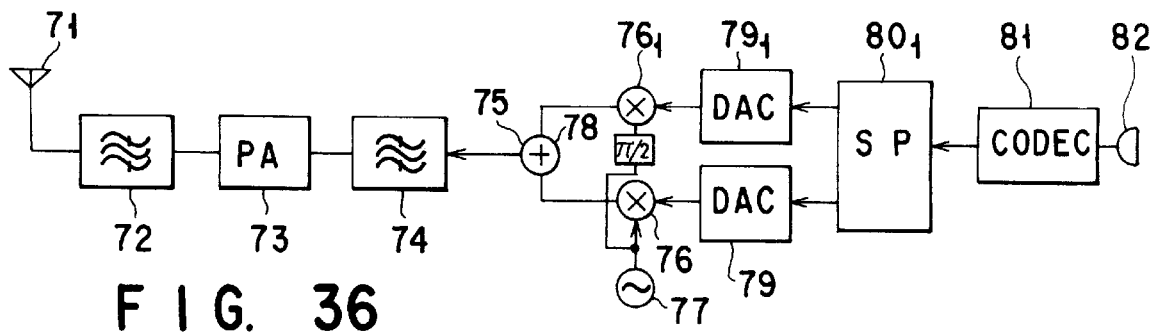
F I G. 36
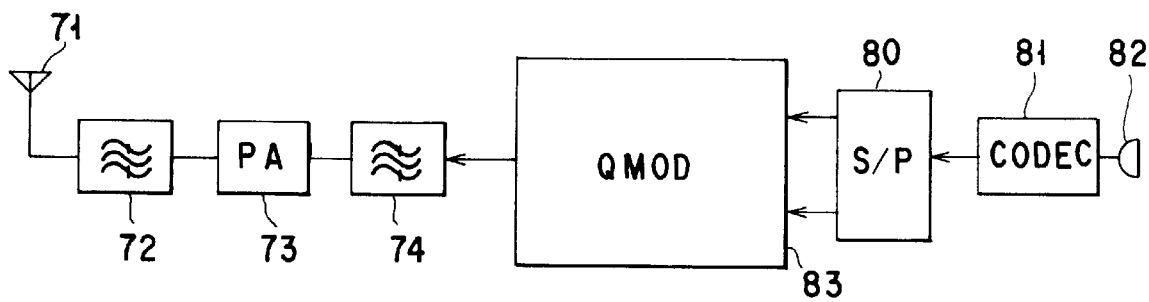
F I G. 37
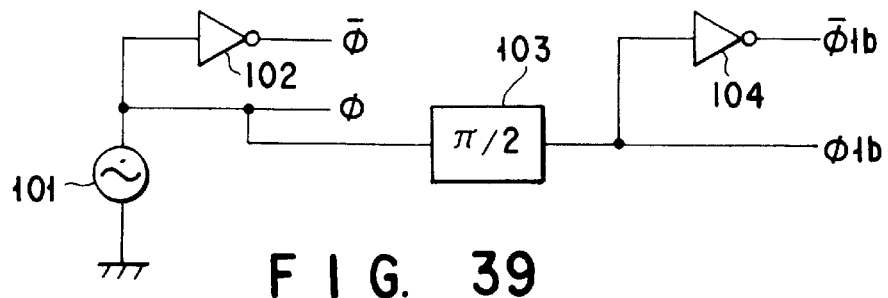
F I G. 39

SELECTION APPARATUS

CROSS-REFERENCE TO RELATED APPLICATIONS

This is a continuation-in-part of U.S. Ser. No. 08/536,278 filed on Sep. 29, 1995, now abandoned.

BACKGROUND OF THE INVENTION

This invention relates to a selection device, and more particularly to a selection device that selects, for example, the outputs of electric cells in a D/A converter, and to various apparatuses using the selection device.

With a conventional digital/analog converter, Din (an integer) unit current cells are selected to produce a current output corresponding to the input digital signal Din. Selecting unit current cells an output current of Io=Icell×Din is produced, whereby digital/analog conversion is effected.

In general, current cells have errors due to variations. If an error in each current cell is *i, the error contained in Io will be expressed by the following equation (1):

$$\sum_{i=0}^{Din} \epsilon_i \qquad (1)$$

Therefore, a differential linear error DNL has the value expressed by equation (2), so that the conversion accuracy is determined with process variations such as variations of manufacturing processes and manufacturing machines being reflected directly in the D/A conversion error:

$$DNL = \epsilon_i \qquad (2)$$

To perform high-accuracy conversion, this scheme either uses an expensive high-accuracy process or requires adjustment such as trimming, resulting in higher cost.

A method that has improved this disadvantage is a dynamic element matching method [1].

In this method, if the conversion time is Ts and the number of bits is $n_{DA}$, the current cell used will be changed at intervals of $Ts/2^{nDA}$ so that all of the cells may be used equally in each conversion. By doing this, the output charge Qout is expressed by the following equation (3):

$$Qout = \sum_{i=1}^{2^{nDA}} I_i \frac{T_s}{2^{nDA}} Din \qquad (3)$$

$$= \frac{T_s}{2^{nDA}} DinI_0 \sum_{i=1}^{2^{nDA}} (1 + \epsilon i) = I_{av} T_s Din$$

where Ii is the output current of the ith cell expressed as:

$$\frac{1}{2^{nDA}} \sum_{i=1}^{2^{nDA}} (1 + \epsilon i) = 1$$

and Iav is a constant expressed as:

$$I_{av} = \frac{1}{2^{nDA}} \sum_{i=1}^{2^{nDA}} (1 + \epsilon i) = 1$$

Because of this, an error in each current cell has an effect only on the gain error. This makes it possible to achieve high conversion accuracy even when there are variations in the cells. Namely, an error in each cell is averaged with respect to time, thereby improving the accuracy.

With the dynamic element matching method, however, each cell must be selected in $½^{nDA}$ of the conversion time, so that the elements are required to operate at high speeds.

As described above, the conventional scheme has the disadvantage that the performance deteriorates significantly due to variations in the elements, such as variations in the current cells. In the case of the dynamic element matching method, the current cells must be changed at a high speed, making it difficult to achieve a high-speed conversion operation.

BRIEF SUMMARY OF THE INVENTION

The object of the present invention is to provide a selection device capable of not only reducing errors by making the operation speed lower, but also decreasing errors at a specific frequency.

According to the present invention, there is provided a selection device comprising: an integrator that integrates, one or more times, data representing the number of times that each of objects having relative error between them was used; and a selector that, on the basis of the integration result of the integrator, selects the objects according to an input signal.

According to the present invention, there is provided a selection device comprising: an integrator that has a table showing each of objects having relative error between them has been selected and integrates, once or more times, data representing the number of times that each object in the table was selected; and a selector that selects the objects according to the integration result of the integrator and an input signal.

According to the present invention, there is provided a selection device comprising: filter means containing a plurality of delay time means that receive a select signal, a plurality of coefficient means connected to the plurality of delay time means, respectively, feedback means that feeds back the output of the coefficient means, and feed-forward means that feeds forward the output of the coefficient means; and a selector that selects the delay time means according to the output of the filter means.

According to the present invention, there is provided a selection device comprising: an integrator that integrates, once or more times, data representing the state that each of objects having relative errors between them has been used; an adder that adds a dither signal to an input signal and outputs an addition signal; and a selector that selects the objects according to the integration result of the integrator and the addition signal.

With the present invention, the effect of errors at an arbitrary frequency can be reduced, improving the accuracy remarkably. Because element accuracy need not be high, no high-accuracy elements are required, enabling cost reduction.

The present invention can provide a selection apparatus for integrating, one or more times, data representing the use/non-use of each of to-be-selected objects having relative errors between them, dividing the objects into groups, integrating, one or more times, data representing the use/non-use of each of the groups, and selecting the objects in accordance with the integration results.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of a selection device according to a first embodiment of the present invention;

FIG. 2 is a block diagram of the selector shown in FIG. 1;

FIG. 3 shows the structure of the selector shown in FIG. 1;

FIG. 12 is a block diagram showing a selection device in which cells are divided into groups in a hierarchical tree-structure, in association with the third embodiment;

FIG. 13 is a block diagram of a comparator circuit connected to the selection device of the third embodiment;

FIG. 14 is a block diagram showing a selection device according to a fourth embodiment of the invention;

FIG. 17 is a block diagram of a selection device according to a fifth embodiment of the present invention;

FIG. 18 is a block diagram of a selection device according to a sixth embodiment of the present invention;

FIG. 19 is a block diagram of a selection device according to a seventh embodiment of the present invention;

FIG. 20 is a block diagram of a selection device according to an eighth embodiment of the present invention;

FIG. 21 is a block diagram of a selection device according to a ninth embodiment of the present invention;

FIG. 23 is a block diagram of a transmitter using a selection device of the invention;

FIG. 24 is a block diagram of a selection device according to a ninth embodiment of the present invention;

FIG. 25 is a block diagram of a selection device according to an eleventh embodiment of the present invention;

FIG. 26 is a block diagram of a selection device according to a twelfth embodiment of the present invention;

FIG. 27 is a block diagram of a selection device according to a 13th embodiment of the present invention;

FIG. 28 is a block diagram of a selection device according to a 14th embodiment of the present invention;

FIG. 29 is a block diagram of a selection device according to a 15th embodiment of the present invention;

FIG. 31 is a block diagram of a selection device according to a 17th embodiment of the present invention;

FIG. 32 is a block diagram of a selection device according to an 18th embodiment of the present invention;

FIG. 33 is a block diagram of a selection device according to a 19th embodiment of the present invention;

FIG. 35 is a block diagram of a receiver using a D/A converter with a selection device of the present invention.

FIG. 36 is a block diagram of a transmitter using a D/A converter with a selection device of the present invention.

FIG. 37 is a block diagram of a transmitter using a D/A converter with a selection device of the present invention;

FIG. 39 is a circuit diagram of a clock generator for generating a clock signal to be supplied to the quadrature modulator shown in FIG. 38.

DETAILED DESCRIPTION OF THE INVENTION

Figure 4:
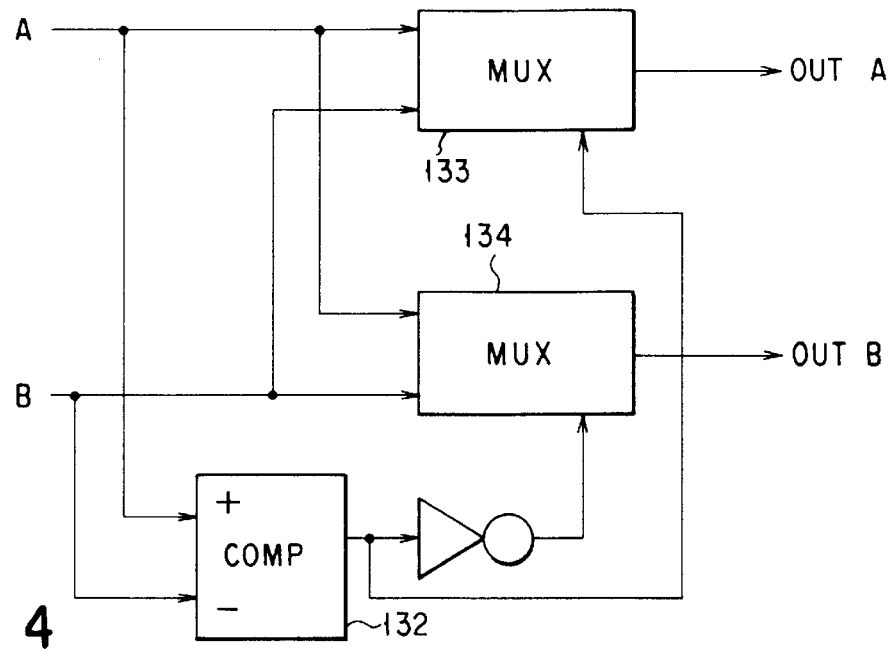
FIG. 4 is a circuit diagram of the selector shown in FIG. 3.

FIG. 1 is a block diagram of a selecting circuit according to a first embodiment of the present invention. FIG. 2 shows the selector in the selection device of FIG. 1. The selection device of FIG. 1 is connected to current cells as shown in FIG. 5.

As shown in FIG. 1, the selection device comprises a selector 13 connected between an input terminal 11 and an output terminal 12, two stages of integrators connected to the output terminal of the selector 13, that is, first and second integrators $14_1$ and $14_2$. The output terminals of the two stages of integrators $14_1$ and $14_2$ are connected to the control terminals of the selector 13. The selector 13, according to the input, selects the linear sum of the output of the first integrator $14_1$ and that of the second integrator $14_2$ in ascending order and then outputs a select signal. The select signal is a signal used for selecting objects from selectable objects, i.e., current cells by the number corresponding to the input signal. The integrators $14_1$ and $14_2$ integrate the select signal.

Specifically, as shown in FIG. 2, the output terminals of the integrators $14_1$ and $14_2$ are connected to the multipliers 16 and 17 of the selector 13, respectively. These multipliers multiply the integral outputs of the integrators $14_1$ and $14_2$ by specific coefficients. The outputs of the multipliers 16 and 17 are added at an adder 18. The addition outputs are compared at a comparator 19 according to the input to determine the large or small relation between them. A selector 20 selects the addition output of the smaller value obtained at the comparator 19 and outputs it as a select signal.

Figure 5:
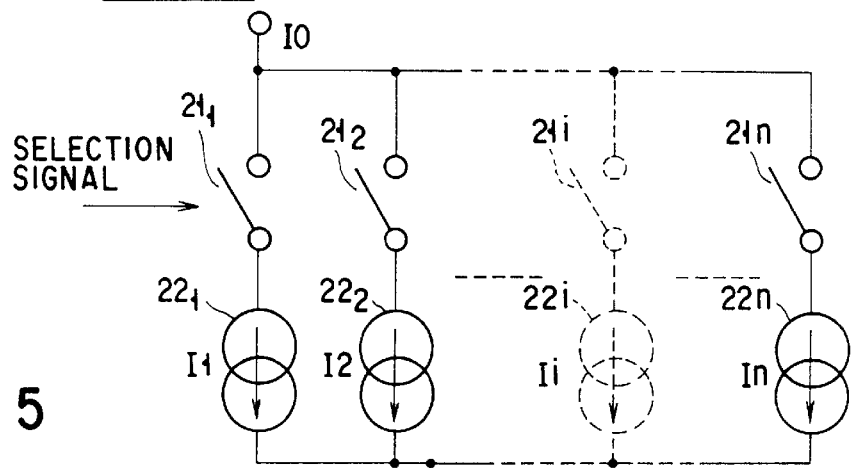
FIG. 5 is a circuit diagram of current cells connected to the selection device of FIG. 1.

The select signal from the selector 20 in the selector 13 selectively opens and closes the switches $21_1$ to $21_n$ of a current cell circuit shown in FIG. 5, thereby selectively connecting the current cells $22_1$ to $22_n$.

In other words, when the selector 13 receives a digital input signal, it outputs a select signal in accordance with a value of the digital input signal. The digital input signal has a value of one level of an analog signal, the selector 13 outputs a select signal for selecting a single current cell. For example, the switch $21_1$ is selected and closed by the select signal, so that the output current from the current cell $22_1$ corresponding to the selected switch $21_1$ is output as an output current Io. If the digital input signal has a value of two levels of an analog signal, the select signal of 110000 . . . 0 for selecting the switches $21_1$ and $21_2$, for example is output from the selector 13. As a result, the currents from the current cells $22_1$ and $22_2$ are added and output as the output signal Io. In such a manner, the currents of the current cells $21_1$ to $21_n$ are selectively added in accordance with the value of the digital input signal to form an output current Io. In other words, the digital signal is converted to an analog signal.

The select signal output from the selector 13 is input to the integrator $14_1$ and integrated thereby. The integration signal is input to the next stage integrator $14_2$ to be further integrated. The integration signals from the integrators $14_1$ and $14_2$ are supplied to the multipliers 16 and 17 of the selector 13, respectively. The result signals of the multipliers 16 and 17 are added by an adder 18. The addition signal is compared with a previous signal in accordance with the input signal by a comparator 19, so that the magnitude relationship between the addition signals is detected. Since the addition signal indicates a value corresponding to the used times of each of the current cells during a predetermined time period, the used times of the current cells during a predetermined period can be compared with one another on the basis of the magnitude relationship between the addition signals. The selector 20 outputs a select signal for selecting the current cells in a descending order of the used times during a predetermined period, in accordance with the comparison result. In other words, the selector 13 outputs a select signal so that the current cells $21_1$ to $21_n$ having characteristic variations are equally used during a predetermined period.

FIG. 3 shows the structure of the selection device 13 in which the number of cells is 8. In FIG. 3, the left side is the input side, and the right side is the output side. In FIG. 3, arrows indicate the directions of comparison. In FIG. 3, rectangular blocks indicate comparison/exchange circuits 131. Each comparison/exchange circuit 131 compares two inputs and exchanges input signals in accordance with the comparison result. Suppose that the arrow is directed upward, the upper-side input is A and the lower-side input is B. If A>B, A is output from the upper-side output and B is output from the lower-side output. If A<B, B is output from the upper-side output and A is output from the lower-side output. Suppose that the arrow is directed downward. In this case, the comparison is performed reversely. If A>B, B is output from the upper-side output and A is output from the lower-side output. If A<B, A is output from the upper-side output and B is output from the lower-side output. Thus, the inputs are rearranged in an order from above beginning with the greatest one, and output from the right-side outputs. In the selection device 13, a predetermined number of to-be-selected cells, which corresponds to the input signal, may be selected in order from below. FIG. 4 shows the circuit configuration of the comparison/exchange circuit 131 shown in FIG. 3. Inputs A and B are compared by a comparator (Comp) 132, and the inputs are selected by multiplexers (MUX) 133 and 134 in accordance with the comparison result. Thereby, the inputs A and B can be exchanged.

In a conventional sorting circuit, in general, the number of required comparison circuits is (n/2) (n−1). If the number n of selectable elements is large, it is difficult to construct the sorting circuit from an aspect of hardware. Thus, this sorting circuit is achieved by means of software, etc. In this case, however, the speed of execution lowers. On the other hand, according to this technique, the number of required sorting circuit stages shown in FIG. 3 is (½)log2N(log2N+1) when the number of inputs is N, and the number of required comparison/exchange circuits is (¼)log2N(log2N+1)N. Consequently, as compared to the prior art, the scale of hardware decreases and it is easier to achieve the hardware.

This enables errors in the output of all of the current cells to be decreased even if each current cell has an error. Unlike the conventional dynamic element matching method, it is not necessary to select each cell in $½^{nDA}$ of the conversion time, and consequently the elements are not required to operate at high speeds.

Figure 6:
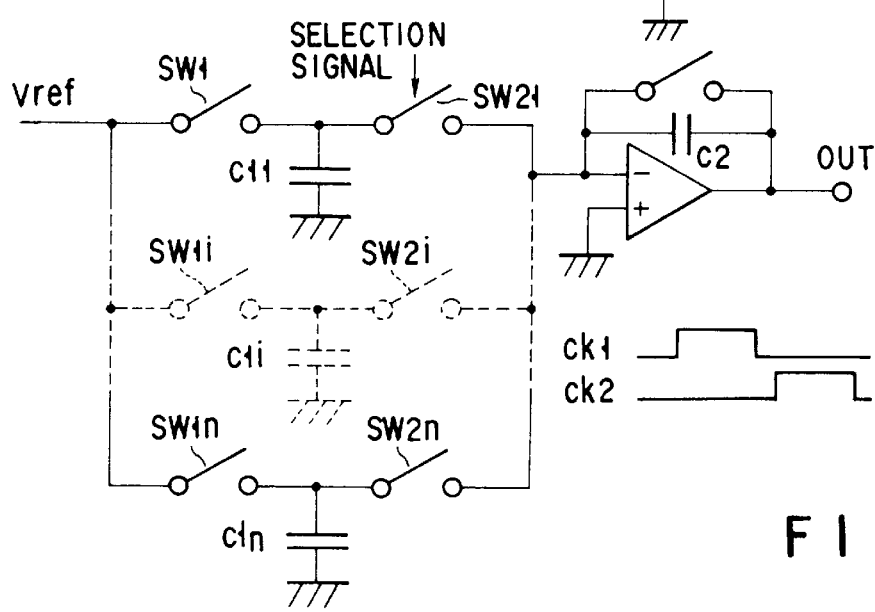
FIG. 6 is a circuit diagram of a capacitor array circuit.

While in the embodiment, the current cells are used as the objects to be selected, the present invention may be applied to a device that adds values having errors to produce an output. For instance, the invention may be applied to a capacitor array as shown in FIG. 6. In this example, clock ck1 closes switches $sw1_1$ to $sw1_n$, thereby charging capacitors $c1_1$ to $c1_n$. Clock ck2 closes the selected switch, for example, switch $sw2_1$, thereby connecting the selected capacitor $c1_1$ to the output side, with the result that the charge corresponding to capacitor c2 is transferred to the output. With a D/A converter that uses a selection device of the present invention which is shown in FIGS. 1 and 2 to select those capacitors $c1_1$ to $c1_n$, even if the capacitors have errors, the effect of the errors can be reduced.

Figure 7:
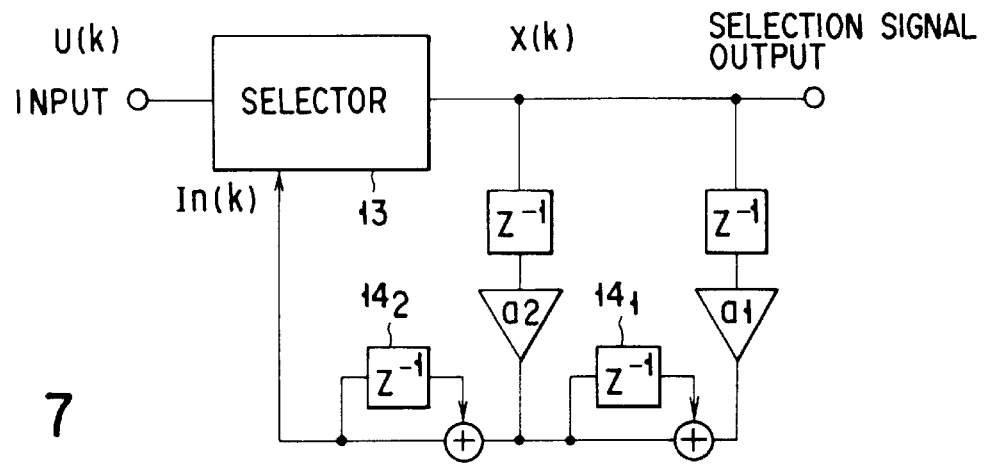
FIG. 7 is a block diagram of a selection device according to a second embodiment of the present invention.

Referring to FIG. 7, a concrete example of a selection device according to the present invention will be explained as a second embodiment. In this embodiment, integrators $14_1$ and $14_2$ are composed of delay elements indicated by $z^{-1}$ and adders. The output of the integrator $14_2$ is inputted to a selector 13.

Figure 8:
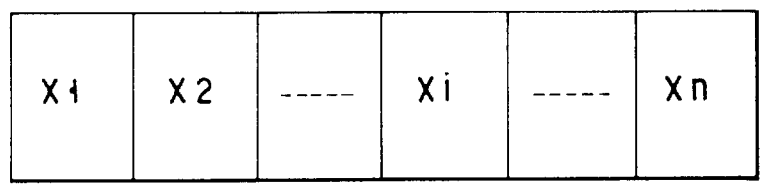
FIG. 8 shows a format for a select signal.

A select signal, the output of the selector 13, is made up of a plurality of signals as shown in FIG. 8. Each signal can take the value of 0 or 1. If the signal is 1, the corresponding current cell will be selected, whereas if the signal is 0, it will not be selected. It is assumed that the integrators $14_1$ and $14_2$ integrate the individual signal in the select signal. Therefore, it can be considered that a plurality of integrators are connected in parallel.

Here, the current Ii in the current cells shown in FIG. 5 is expressed by the following equations (4) and (5):

$$I_i = I_{av}(1 + \epsilon_i) \tag{4}$$

$$I_{av} = \frac{1}{n} \sum_{i=1}^{n} I_i \tag{5}$$

A vector indicating the select signal at time k is expressed by the following equation (6):

$$X(k)=[x_1(k), x_2(k) \ldots x_i(k) \ldots x_n(k)]^T \tag{6}$$

It is assumed that the input signal is U(k) and U(k) is an integer taking the value ranging from 0 to n.

The selector 13 operates in such a manner that it brings as many select signals which correspond to the input into the 1 state, in ascending order of the value of the outputs In(k) of the integrators $14_1$ and $14_2$.

X(k) indicates the current cell to be selected. The current output Iout is determined by the following equations (7) and (8):

$$I_{out}(k)=<C, X(k)> \tag{7}$$

$$C=[I_{av}\cdot(1+\epsilon_1)I_{av}(1+\epsilon_2) \ldots I_{av}(1+\epsilon_i) \ldots I_{av}(1+\epsilon_n)] \tag{8}$$

where <. , . > indicates the inner product of a vector.

Here, X is a vector representing the selection of a cell as described above. As shown in equation (7), the current actually outputted contains error Iouterr, which can be expressed by the following equations (9) and (10):

$$I_{outerr}(k) = <C_{err}, X(k)> \tag{9}$$

$$C_{err} = [I_{av}\epsilon_1, I_{av}\epsilon_2 \ldots I_{av}\epsilon_i, I_{av}\epsilon_n] \tag{10}$$

Therefore, X(k) is used to determine the error contained in the output. From equation (4) and equation (5), the following equation (11) is obtained:

$$\sum_{i=1}^{n} \epsilon_i = 0 \tag{11}$$

That the selector 13 operates in such a manner that it brings as many select signals which correspond to the input into the 1 state, in ascending order of the values of the outputs In(k) of the integrators $14_1$ and $14_2$ is equivalent to selecting a vector X(k) closest to the opposite vector to In(k) vector by using as many factors as the number of inputs.

The error vector at that time is expressed by the following equation (12):

$$Q(k) = In(k) + X(k) [q_1(k), q_2(k) \ldots q_i(k) \ldots q_n(k)]^T \tag{12}$$

Figure 9:
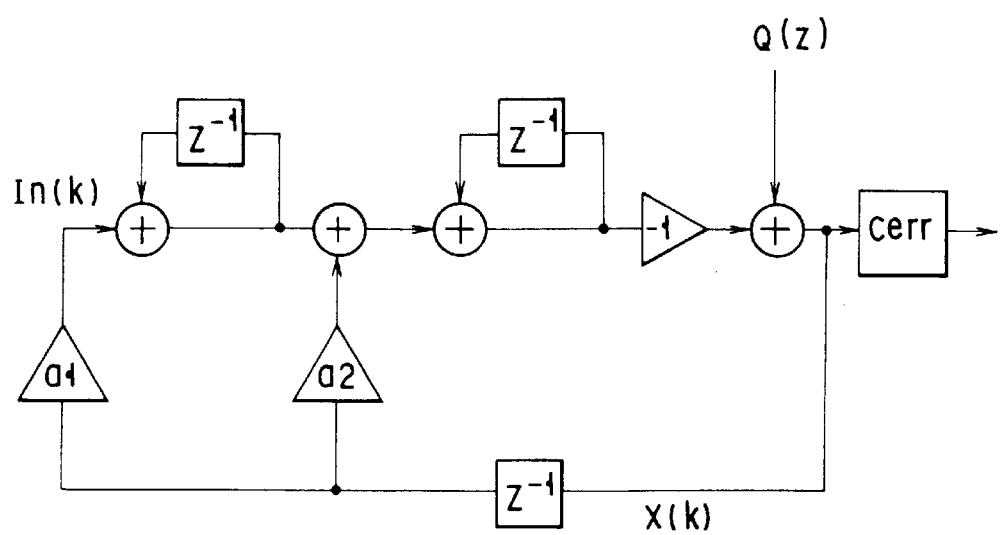
FIG. 9 is an equivalent circuit in connection with errors in the second embodiment.

In this case, if conversion is represented as Q(z), an equivalent circuit for errors in the present embodiment can be expressed as shown in FIG. 9. With the equivalent circuit, a transfer function from error Q to X is given by the following equation (13):

$$X(z) = \frac{(1 - Z^{-1})^2}{(1 - \alpha_2)z^{-2} + (-2 + \alpha_1 + \alpha_2)z^{-1} + 1} Q(z) \tag{13}$$

If $\alpha_1 = 1$ and $\alpha_2 = 1$, the following equation (14) will hold:

$$X(z) = (1 - z^{-1})^2 Q(z) \tag{14}$$

Figure 10:
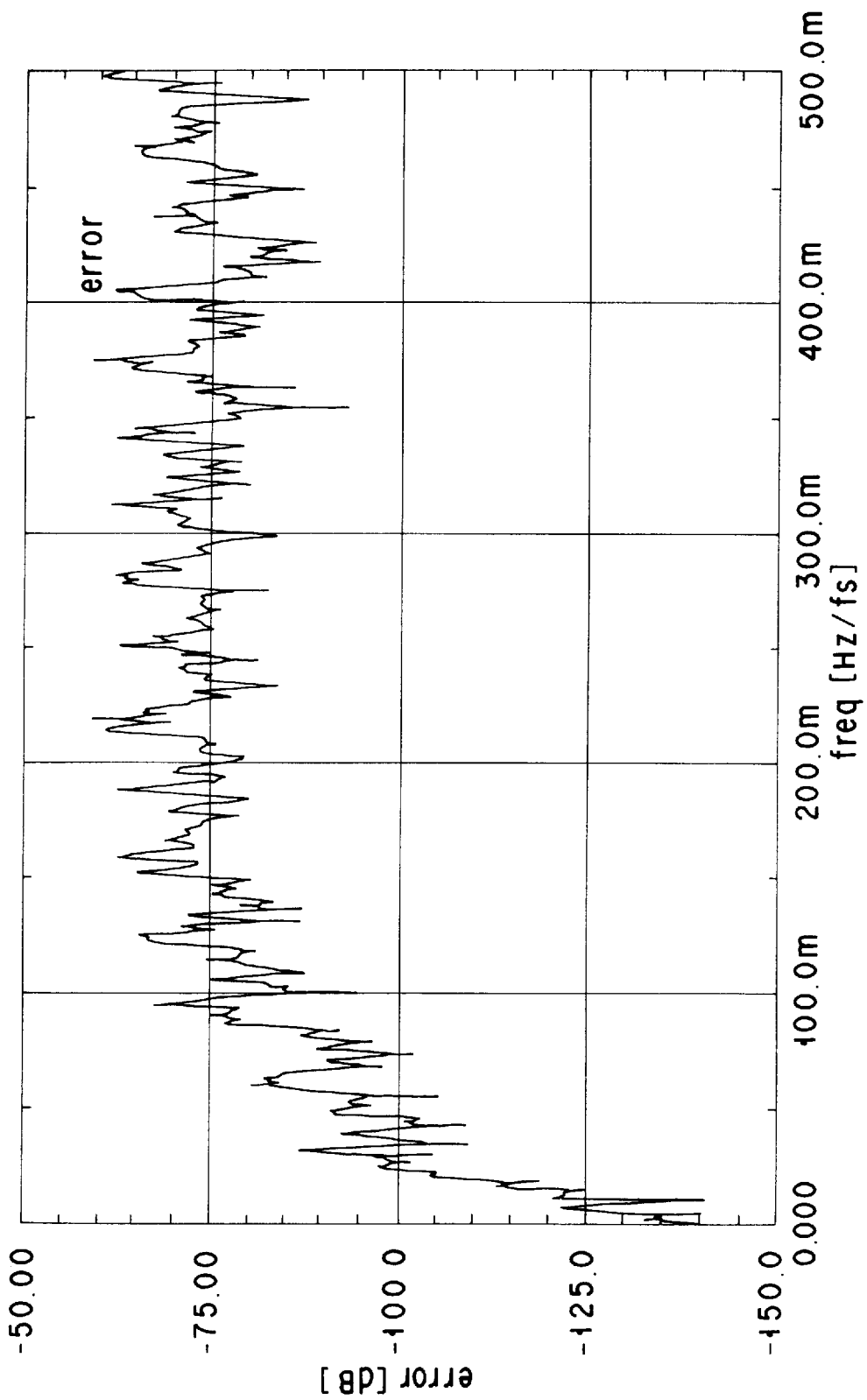
FIG. 10 shows the simulation result related to errors in the second embodiment.

In equation (14), Q(z) is multiplied by a noise shaping term $(1 - z^{-1})^2$, from which it is understood that Q(z) undergoes second-order shaping. The simulation result of error signals in the output is shown in FIG. 10. From the figure, errors are suppressed in lower-frequency regions.

As for the actual output, the output Io shown in FIG. 5 may be a current output, or the current output may undergo current-to-voltage conversion to produce a voltage output.

As described above, use of the present embodiment reduces the effect of an error in each current cell remarkably in the vicinity of DC, making it possible to construct a high-accuracy D/A converter even when there are variations in the elements. Since a high-accuracy process is not needed, it is possible to reduce cost.

A third embodiment of the present invention in which the comparison/exchange circuit 31 is dispensed with will now be described with reference to FIGS. 11, 12 and 13.

Figure 11:
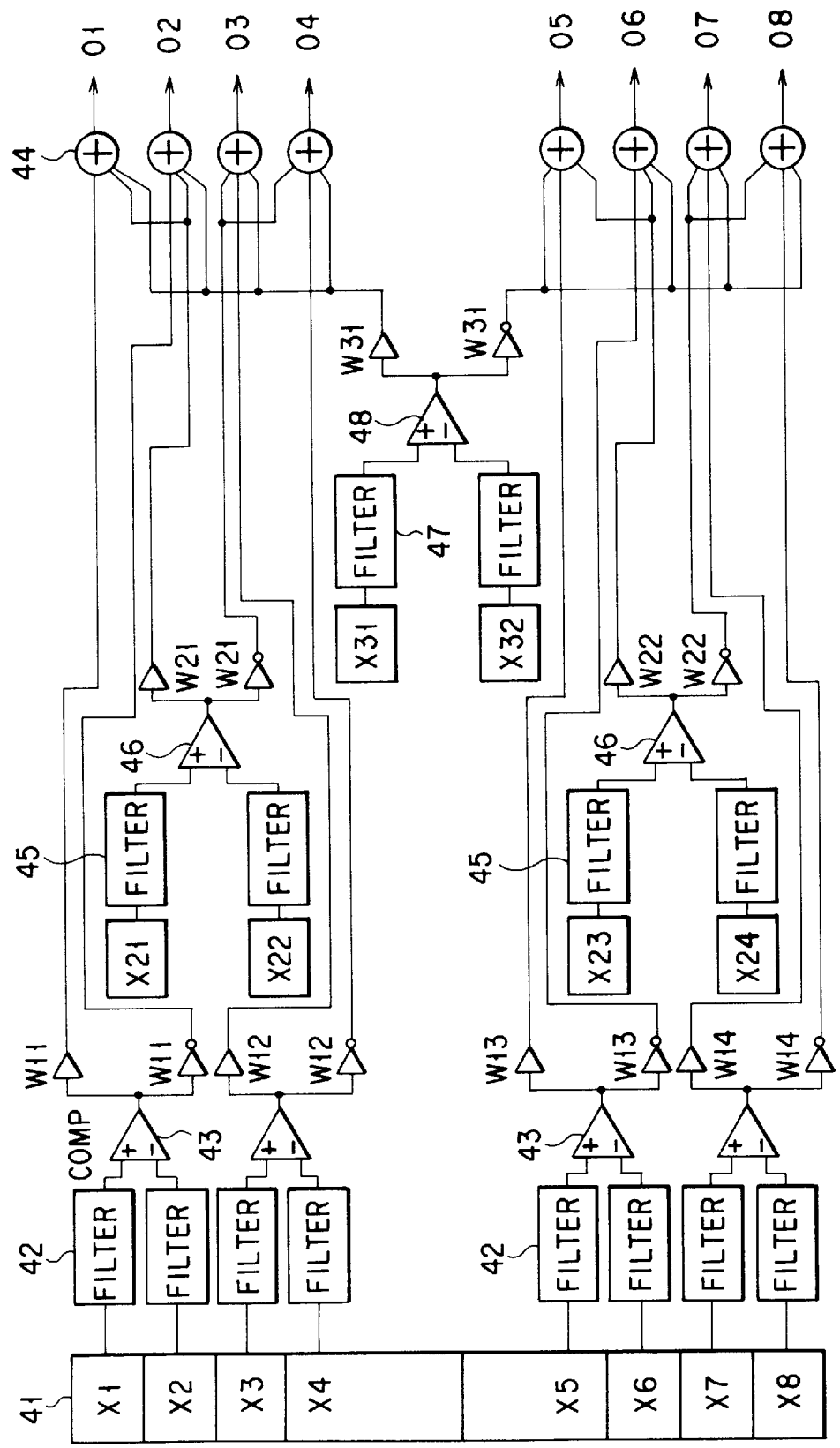
FIG. 11 is a block diagram of the selection device according to a third embodiment of the invention.

In FIG. 11, pairs of registers X1, X2; X3, X4; ... ; X7, X8 are connected to the associated inputs of comparators 43 via associated pairs of filters 42. Outputs from the comparators are delivered to associated pairs of weighting coefficient devices W11, W12, ... W14. Outputs from the pairs of weighting coefficient devices are input to associated pairs of adders 44.

On the other hand, as shown in FIG. 11, a pair of registers X21 and X22 reconstruct the outputs from the pair of registers X1 and X2 and the outputs from the pair of registers X3 and X4. The registers X21 and X22 are connected to the inputs of a comparator 46 via a pair of filters 45. An output from the comparator 46 is delivered to inputs of a pair of associated weighting coefficient devices W21 and W22. Outputs from the pair of coefficient devices W21 and W22 are connected to the inputs of the associated adders 44. Similarly, a pair of registers X31 and X32 reconstruct the outputs from the pairs of registers X21, X22 and X23, X24, as shown in FIG. 11. The paired registers X31 and X32 are connected to the inputs of a comparator 48 via a pair of filters 47. The output of the comparator 48 is delivered to the inputs of a pair of associated weighting coefficient devices W31. The outputs from the coefficient devices W31 are connected to the inputs of the associated adders 44. Specifically, the adders 44 are divided into a group for adding the outputs from the coefficient devices W11(W12), W21 and W31 and a group for adding the outputs from the coefficient devices W13(W14), W22 and W31.

In the preceding embodiment, the selection signal Xn is integrated, thereby to select the cell with a small integration value. In this embodiment, as shown in FIG. 12, the cells are divided into groups in a hierarchical tree-structure on the basis of the selection signals (Xn). Registers are newly constituted on the basis of the number of times of selection of the groups. Specifically, registers X1 to X8 are divided into groups, and outputs from the register groups are reconstructed by registers X21 to X24. In addition, the registers X21 to X24 are divided into groups, and outputs from the register groups are reconstructed by registers X31 and X32. The outputs from the registers Xn (i.e. X1 to X8) and Xnn (i.e. X21, X22, X31, X32) are passed through filters and then weighted and added, as shown in FIG. 11. Thus, outputs On (i.e. O1 to O8) are obtained. Specifically, if the integration is performed twice in the filters, as in the preceding embodiment, second-order shaping characteristics can be obtained. If the filters have band-pass characteristics, shaping characteristics with band-limit characteristics can be obtained. By selecting a proper weight Wnn, outputs O1 to O8 with no overlap can be obtained. For example, the weights can be set as follows: W11=4, W12=4, W13=4, W14=4, W21=2, W22=2 and W31=1. If the weight of the lower-level register (closer to Xn) is increased, the selection of cells is equally carried out in the group. If the weight of the higher-level register is increased, the selection of each group is equally carried out.

In the case where the proper weight Wnn has been selected to obtain non-overlapping values, if a comparator circuit, as shown in FIG. 13, is used, the selection device can be constituted without using the comparison/exchange circuit. This comparator circuit is provided with a plurality of comparators (COMP) for comparing outputs O1 to O8 with an input. Outputs from the comparators are sent to registers X1 to X8 via delay circuits (D).

According to the method of the above embodiment, the number of required comparators is N−1. As compared to the preceding embodiment, the number of comparators may be about 4/log2N(log2N+1). It is understood that the method of this embodiment is advantageous when the number N increases.

An embodiment wherein the number of cells is set at N in the above embodiment will now be described with reference to FIGS. 14, 15 and 16.

According to this embodiment, each pair of registers X1, X2; X3, X4; ... ; Xn−2, Xn of a register array 51 are connected to the inputs of an associated comparator 53 via an associated pair of filters 52. The outputs from the comparators 53 are input to the associated weighting coefficient devices W11, W12, ... , W1n. Outputs from the comparator 53 and associated coefficient device are input to an associated pair of adders 54.

Figure 15:
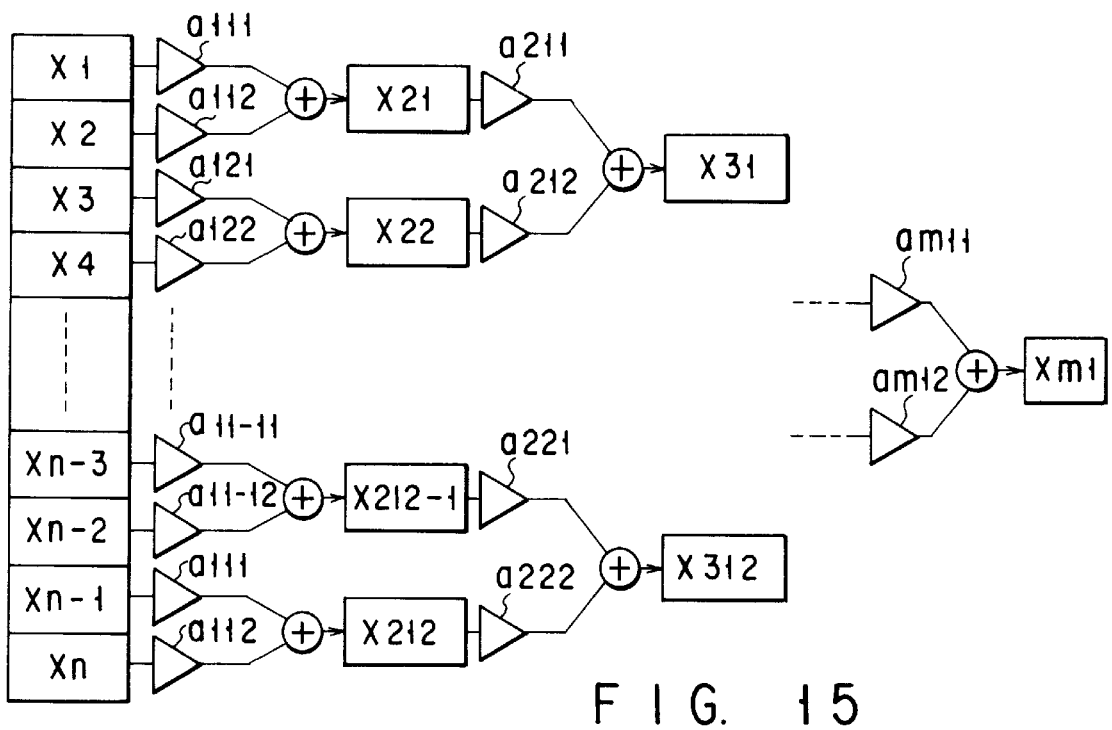
FIG. 15 is a block diagram showing a selection device in which cells are divided into groups in a hierarchical tree-structure, in association with the fourth embodiment.
Figure 16:
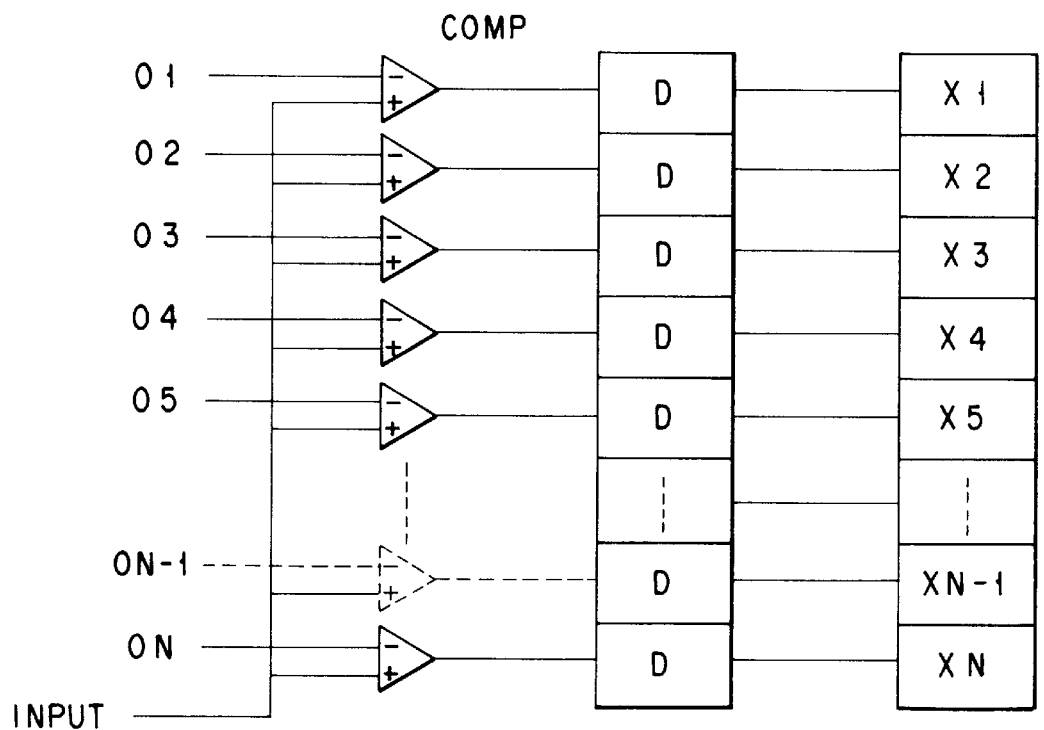
FIG. 16 is a block diagram of a comparator circuit connected to the selection device of the fourth embodiment.

On the other hand, as shown in FIG. 15, a pair of registers X21 and X22 reconstruct outputs from an associated pair of registers X1, X2; ...; Xn−1, Xn. The registers X21 and X22 are connected to inputs of an associated comparator 56 via a pair of filters 55. The output from the comparator 56 is delivered to the input of an associated weighting coefficient device W21. The outputs from the comparator 56 and associated coefficient device are connected to the inputs of the associated adders 54. Similarly, a pair of registers Xn1 and Xn2 (n=1, 2, 3, . . . ) are connected to the inputs of a comparator 60 via a pair of filters 59. An output from the comparator 60 is delivered to the inputs of associated weighting coefficient devices Wn1. The outputs from the comparator 60 and coefficient devices Wn1 (n=1, 2, 3, . . . ) are connected to the inputs of the associated adders 54.

In addition, a pair of registers X31 and X32, as shown in FIG. 15, reconstruct outputs of a pair of registers Xn1, Xn2; ...; Xn−1, Xn. The registers X31 and x32 are connected to the inputs of a comparator 58 via a pair of filters 57. The output from the comparator 58 is connected to the input of an associated weighting coefficient device W31. The outputs of the comparator 58 and coefficient device 31 are connected to inputs of the associated adders 54. Similarly, a pair of registers Xp1 and xp2 are connected to inputs of a comparator 60 via a pair of filters 59. The output of the comparator 60 is connected to the input of an associated weighting coefficient device Wqx. The outputs of the comparator 60 and coefficient device Wqx are connected to the inputs of the associated adders 54.

Specifically, in this embodiment, too, the registers are divided into groups in a hierarchical structure, as shown in FIG. 15, and the selection device can be constructed even if the number N of registers is increased. In the case where the proper weight Wnn has been selected to obtain non-overlapping values, if a comparator circuit, as shown in FIG. 16, is used, the selection device can be constituted without using the comparison/exchange circuit. The number of required comparators in the method of this embodiment is only on the order of N.

An embodiment of the filter shown in FIGS. 11 and 14 will now be described with reference to FIG. 17.

In this embodiment, use of a single integrator 14 simplifies the configuration. Because the noise shaping characteristic is of the first order and gentle, the present embodiment is effective when the over-sampling ratio cannot be made large. The characteristic of a filter placed behind can be made gentle.

Furthermore, the frequency at which shaping suppresses noise can be set using $\alpha 2$. For instance, if $\alpha 2=-1$, the frequency can be set at half of the sampling frequency.

FIG. 18 shows a fourth embodiment of the present invention. With this embodiment, three integrators $14_1$, $14_2$, and $14_3$ are connected, thereby realizing a third-order shaping characteristic. A higher-order shaping characteristic can reduce noise more in the vicinity of DC, enabling a higher-accuracy conversion.

A transfer function related to error at this time can be expressed by the following equation (15):

$$X(z) = \frac{(1-z^{-1})^3}{(a_3-1)z^{-3}+(-a_2-2a_3+3)z^{-2}+(a_1+a_2+a_3-3)z^{-1}+1} Q(z) \quad (15)$$

Generally, with a third-order or higher $\Delta\Sigma$ modulator, when the poles of the transfer function are placed at the origin, the operation becomes unstable. Therefore, the pole must be placed at stable points inside the unit circle.

Similarly, a higher-order shaping characteristic can be realized. A fifth embodiment of the nth order according to the present invention is shown in FIG. 19. In the present embodiment, n stages of integrators $14_1$ to $14_n$ are provided. By raising the order, it is possible to improve the accuracy more.

A sixth embodiment according to the present invention using another configuration of the nth order will be explained with reference to FIG. 20.

In this embodiment, a filter 15 is connected between the select signal output terminal 12 and the selector 13. The filter 15 comprises a plurality of delay circuits $DL_1$ to $DL_n$ that receive a select signal, a plurality of coefficient multiplier circuits $\alpha_1$ to $\alpha_n$ connected to said plurality of delay circuits respectively, and to the selector 13, and a plurality of coefficient multiplier circuits $\beta_1$ to $\beta_n$ connected to the delay circuits $DL_1$ to $DL_n$ respectively, and to the select signal output terminal 12.

With this configuration, it is possible to place the zero points and the poles of the noise transfer characteristic at arbitrary points. Therefore, it is possible to reduce not only errors in the vicinity of DC but also errors at high frequencies. For instance, in the case of the fourth order, to set two zero points at the origin and two zero points at fs/m, if a transfer function for the section indicated by a dotted line from Fin to Fout is F(z)=[z(z)]/[P(z)], βi will be determined using the following equation (16):

$$P(z) = (1-z^{-1})^2\left(1-2\cos\left(\frac{\pi}{m}\right)z^{-1}+z^{-2}\right) \quad (16)$$

In this case, the pole is set using $\alpha i$. By using this scheme, it is possible to directly convert a band-pass signal such as an intermediate frequency signal in the superheterodyne system.

Figure 22:
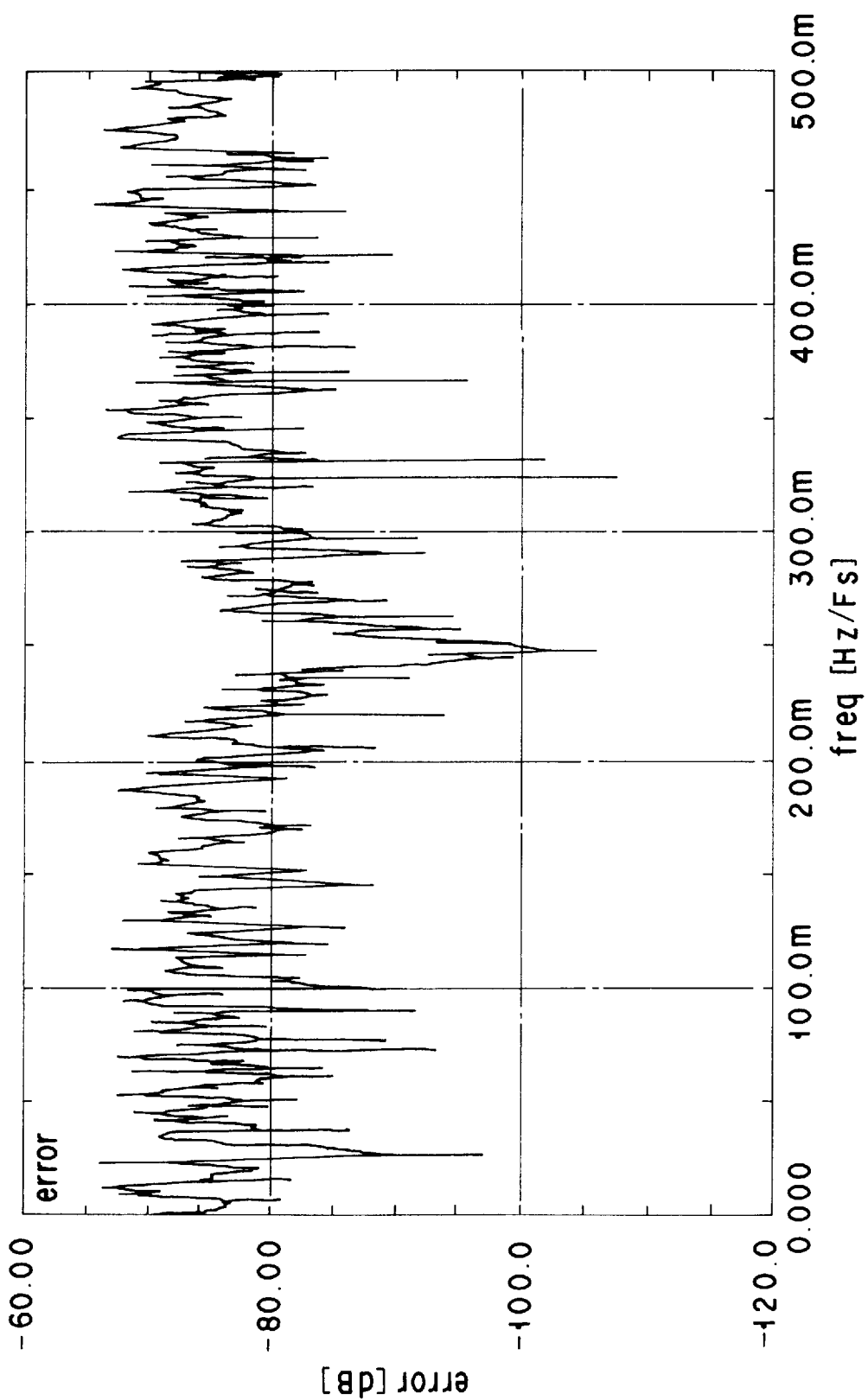
FIG. 22 shows the simulation result related to errors in the ninth embodiment.

An embodiment of the invention where a zero point is placed at fs/4 in the second order, thereby improving the accuracy at fs/4, is shown in FIG. 21. In this embodiment, the coefficients of the digital filter 15 are as follows: $\alpha 1=0$, $\alpha 2=-1$, $\alpha 3=0$, $\beta 1=0$, and $\beta 2=2$. The simulation result of the frequency characteristic at that time is shown in FIG. 22. From the simulation result, it can be seen that the error components near fs/4 are reduced by noise shaping.

FIG. 23 shows an embodiment of a transmitter using the present invention. With this embodiment, the inputted digital signal is converted by a D/A converter 25 using the present invention into an analog signal, the unnecessary components of which are attenuated by a filter 26. The resulting signal is then frequency-converted and thereafter amplified at an amplifier 27, which supplies the output.

Here, the inputted digital signal is an IF signal that has undergone the necessary modulation. This makes it unnecessary to use a high-accuracy analog modulator. The D/A converter 25 using a selection device of the invention realizes high-accuracy digital/analog conversion, thereby providing a high-accuracy IF signal. As a result, it is possible to construct a high-accuracy transmitter easily.

With a low intermediate frequency, by directly digitally modulating the carrier-frequency signal, the frequency converter can be eliminated.

A seventh embodiment where a dither signal is applied to the present invention will be explained with reference to FIG. 24.

In the above embodiments, when a DC signal is supplied to the input, the selection of current cells becomes periodic, leading to the disadvantage that noise components concentrate on a specific frequency.

With the present embodiment, a dither signal from a dither signal generator 28 is added to the input signal at an adder 29, thereby changing the input even when a DC input arrives to reduce the concentration of noise components. The added dither signal passes through a D/A converter 30 and is subtracted at an adder 31 on the output side, which removes the added dither signal. When the output signal is connected to a low-pass filter to produce the final output, use of a dither signal whose frequency is higher than the cut-off frequency of the low-pass filter enables the dither signal to be removed.

An eighth embodiment where the present invention is applied to an internal D/A converter in a $\Delta\Sigma$ modulation D/A converter will be explained with reference to FIG. 25.

In the present embodiment, a feedback made up of integrators $31_1$ and $31_2$, a quantizer 31, coefficient multipliers $33_1$ and $33_2$, and a delay circuit 34, is connected to a D/A converter 35. The D/A converter 35 is provided with a selection device of the invention.

In many cases, a 1-bit D/A converter, which generates no relative error theoretically, is used as the internal D/A converter in the $\Delta\Sigma$ modulation D/A converter. In this case, use of a D/A converter using a selection device of the invention can reduce not only relative error but also absolute error. As described above, in general, the reference voltage or current generated contain errors. When the errors are distributed with the true value in the center and the average of them is 0, an error in the absolute error can be reduced.

When multi-bit converters are used as an internal A/D and D/A converters in the $\Delta\Sigma$ modulation D/A converter, making the data length of A/D and D/A 1 bit longer enables the S/N ratio to be improved by 6 dB. However, the noise generated at the internal D/A converter appears directly at the output. When a multi-bit converter was used as an internal D/A converter in a conventional $\Delta\Sigma$ modulation D/A converter, the conversion accuracy of the internal D/A converter was lower than the generally expected conversion accuracy, with the result that the overall conversion accuracy was determined by the accuracy of the internal D/A converter and consequently a high conversion accuracy could not be realized. Furthermore, to realize a high conversion accuracy, trimming was needed, leading to a rise in the cost.

When a D/A converter using a selection device of the invention is used as the internal D/A converter in the $\Delta\Sigma$ modulation D/A converter, the effect of the accuracy of the elements (e.g., current cells) constituting the internal D/A converter is reduced remarkably in the vicinity DC. Therefore, use of the present invention makes it possible to improve the overall conversion accuracy even if a process with a low element accuracy is used.

Furthermore, although a third-order or higher $\Delta\Sigma$ modulator is generally unstable in operation, use of multi-bit converters for the internal A/D and D/A converters enables the modulator to operate stably. If the order of the $\Delta\Sigma$ modulator can be raised, the over-sampling ratio can be lowered, making it unnecessary to use high-speed elements. When the modulator is operated at the same over-sampling ratio, much higher-accuracy conversion can be realized.

When the $\Delta\Sigma$ modulator and the selection device of the invention are of the band-pass type, a band-pass D/A converter, or a band-pass converter that improves the conversion accuracy at an arbitrary frequency, can be realized. For instance, in an embodiment where a zero point is placed at fs/4 to improve the accuracy at fs/4, a D/A converter using the band-pass selection device shown in FIG. 21 is used as the internal D/A converter in the band-pass $\Delta\Sigma$ modulator shown in FIG. 26.

In the embodiment of FIG. 26, the delay signal from the node at which delay circuits $34_1$ and $34_2$ are connected is inverted at an inverter circuit 37. The inverted signal is input to a quantizer circuit 32, which quantizes it.

Furthermore, in the embodiment shown in FIG. 25, the input to the selection device, or the input to the internal D/A converter 35, is the output of the $\Delta\Sigma$ modulator. Therefore, even when DC is supplied as an input signal, the input to the selection device is a signal subjected to $\Delta\Sigma$ modulation. Furthermore, use of a multi-bit converter as the D/A converter 35 in the $\Delta\Sigma$ modulator enables the concentration of noise components to be reduced in the modulator. Therefore, although direct input of a DC signal to the selection device of the invention causes the disadvantage that noise components concentrate on a specific frequency, the present embodiment can reduce the effect of noise concentration.

A ninth embodiment where the present invention is applied to an internal D/A converter in a cascade $\Delta\Sigma$ modulation D/A converter 35 will be explained with reference to FIG. 27.

The cascade $\Delta\Sigma$ modulator is a high-order modulator where $\Delta\Sigma$ modulators containing integrators 31 are cascade-connected. A third-order or higher modulator of this type operates stably and is also known as the MASH type modulator.

The MASH type has the disadvantage that even when the output of each $\Delta\Sigma$ modulator is 1 bit, the final output is multiple bits, requiring a multi-bit D/A converter. The overall performance of the modulator is limited by the multi-bit D/A modulator. PWM has been used for a conventional D/A converter. Use of PWM requires a pulse whose duration is a fraction of the D/A conversion time and consequently needs a very high-speed clock frequency. Therefore, to realize a high conversion accuracy, high-speed elements are needed, resulting in higher power consumption.

When a D/A converter using a selection device of the invention is used as the internal converter in the MASH D/A converter, a high-speed clock is not required, making it possible to realize high-accuracy conversion. Furthermore, the clock frequency can be lowered, making it possible to reduce the power consumption.

While in the present embodiment, each $\Delta\Sigma$ modulator cascade-connected is a first-order modulator having a single integrator, an nth-order modulator where n integrators are connected may be used as each $\Delta\Sigma$ modulator.

A tenth embodiment where the present invention is applied to an internal D/A converter in a $\Delta\Sigma$ modulation A/D converter will be explained with reference to FIG. 28.

When multi-bit converters are used as the internal A/D and D/A converters in the $\Delta\Sigma$ modulation D/A converter, making the data length at the A/D and D/A converter 1 bit longer enables the S/N ratio to be improved by 6 dB. However, the noise generated at the internal D/A converter appears directly at the output. When a multi-bit converter was used as an internal D/A converter in a conventional $\Delta\Sigma$ modulation D/A converter, the conversion accuracy of the internal converter was lower than the generally expected conversion accuracy, with the result that the overall conversion accuracy was determined by the accuracy of the internal D/A converter and consequently a high conversion accuracy could not be realized. Furthermore, to realize a high conversion accuracy, trimming was needed, leading to a rise in the cost.

When a D/A converter using a selection device of the invention is used as the internal D/A converter in the $\Delta\Sigma$ modulation D/A converter, the effect of the accuracy of the elements (e.g., current cells) constituting the internal D/A converter is reduced remarkably in the vicinity of DC. Therefore, use of the present invention makes it possible to improve the overall conversion accuracy even if a process with a low element accuracy is used.

Furthermore, although a third-order or higher ΔΣ modulator is generally unstable in operation, use of multi-bit converters for the internal A/D and D/A converters enables the modulator to operate stably. If the order of the ΔΣ modulator can be raised, the over-sampling ratio can be lowered, making it unnecessary to use high-speed elements. When the modulator is operated at the same over-sampling ratio, much higher-accuracy conversion can be realized.

As shown in FIG. 28, the output of the internal D/A converter 36 is connected to the inputs of the integrators $31_1$ and $31_2$. Since in the ΔΣ modulator, the effect of errors in the D/A converter 36 is the greatest in the first stage, only applying a D/A converter using a selection device of the invention to D/A conversion at the first stage can produce a great effect.

Although the ΔΣ modulator having a zero point on DC has been explained, when the ΔΣ modulator and the selection device of the invention are of the band-pass type, a band-pass D/A converter, or a band-pass converter that improves the conversion accuracy at an arbitrary frequency, can be realized.

For instance, an embodiment where a zero point is placed at fs/4 to improve the accuracy at fs/4 is shown in FIG. 29. A D/A converter 36 using the band-pass selection device shown in FIG. 21 is used as the internal D/A converter in the band-pass ΔΣ modulator shown in FIG. 29.

Furthermore, in the embodiment shown in FIG. 28, the input to the selection device, or the input to the internal D/A converter, is the output of the ΔΣ modulator. Therefore, even when DC is supplied as an input signal, the input to the selection device is a signal subjected to ΔΣ modulation. Furthermore, use of a multi-bit converter as the D/A converter in the ΔΣ modulator enables the concentration of noise components to be reduced in the modulator. Therefore, although direct input of a DC signal to the selection device of the invention causes the disadvantage that noise components concentrate on a specific frequency, the present embodiment can reduce the effect of noise concentration.

Figure 30:
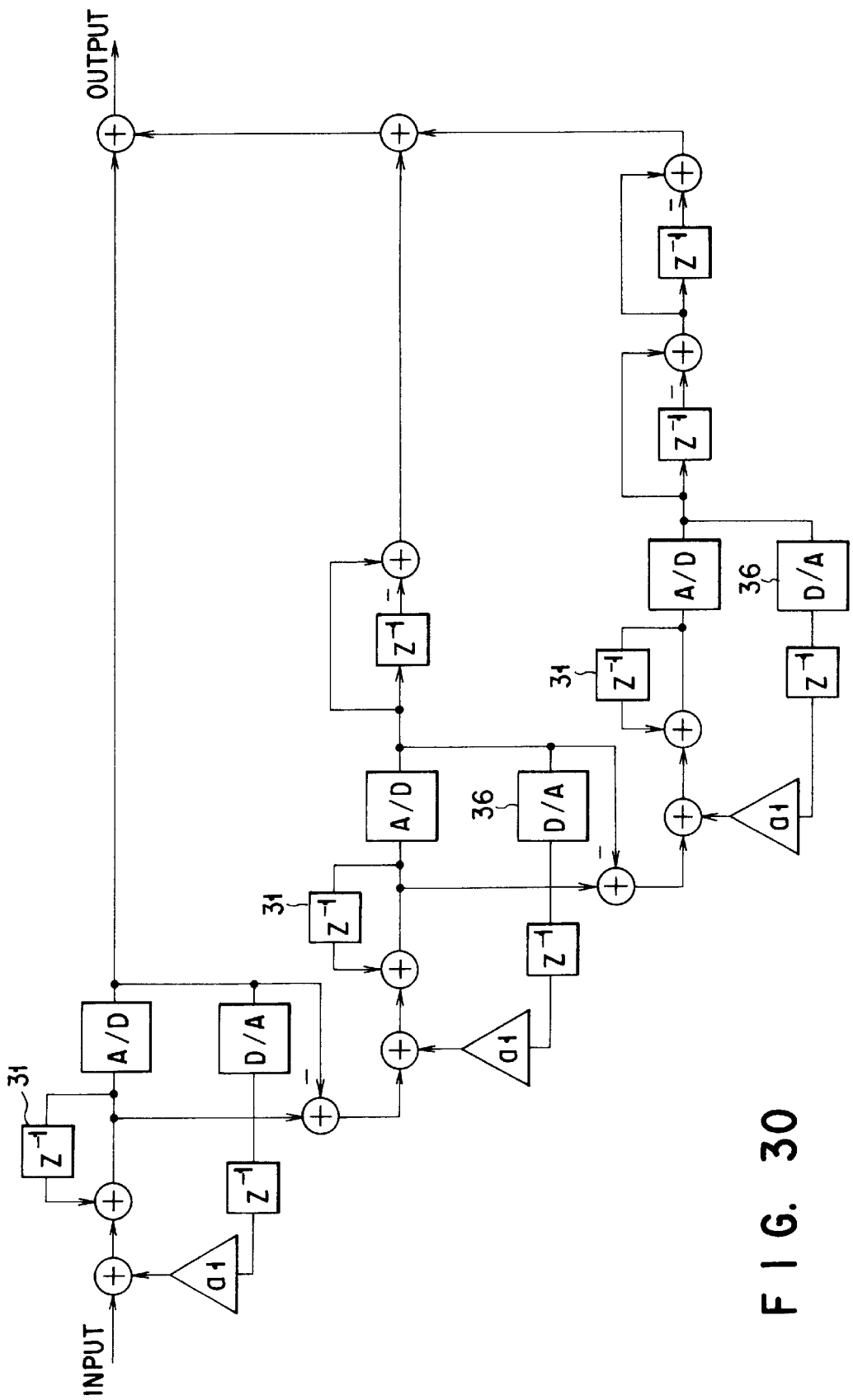
FIG. 30 is a block diagram of a selection device according to a 16th embodiment of the present invention.

An eleventh embodiment where the present invention is applied to an internal D/A converter in a cascade ΔΣ modulation A/D converter will be explained with reference to FIG. 30.

The cascade ΔΣ modulator is a high-order modulator where ΔΣ modulators are cascade-connected. A third-order or higher modulator of this type operates stably and is also known as the MASH-type modulator.

The MASH type has the disadvantage that since quantization noises mixed in the individual ΔΣ modulators are canceled digitally, the difference between the transfer characteristic of each ΔΣ modulator and the ideal values appear directly as cancel errors and consequently the requirements for element accuracy is severe.

Therefore, using a multi-bit internal A/D and D/A converters in each stage enables quantization noise itself to be reduced, thereby decreasing the effect of the cancel error.

Accordingly, use of a D/A converter using a selection device of the invention remarkably reduces the effect of the accuracy of the elements (e.g., current cells) constituting the internal D/A converter in the vicinity of DC, so that a high-accuracy converter can be realized.

Because the effect of the cancel error in the second stage and later is reduced by noise shaping, it is less than the effect in the first stage. For this reason, only using the internal D/A converter of the invention in the first stage can also produce a great effect.

A twelfth embodiment of the present invention will be explained with reference to FIG. 31.

A method of reducing cancel error in the first stage is to make the ΔΣ modulator in the first stage of the second order or higher. For instance, in the case of the second order, the effect of the difference between the transfer characteristic of the first stage and the ideal values on cancel error undergoes the first-order noise shaping. Therefore, the effect of element accuracy can be reduced.

Furthermore, use of a D/A converter using a selection device of the invention remarkably reduces the effect of the accuracy of the elements (e.g., current cells) constituting the internal D/A converter in the vicinity of DC, so that a higher-accuracy converter can be realized.

FIG. 32 shows a thirteenth embodiment where the present invention is applied to an amplitude modulator.

In this embodiment, the output terminal of a carrier wave oscillator (OSC) is connected to the base terminals of transistors $TR_1$ to $TR_n$ connected in parallel with each other and a resistor R connected to the collector terminals produces a voltage output. Switches $SW_1$ to $SW_2$ are inserted between the resistor R and the transistors $TR_1$ to $TR_n$. Controlling the switches according to the switch signal input changes the amplitude of the carrier wave, thereby producing the amplitude-modulated output. Using a selection device of the invention for control of the switches alleviates the effect of errors stemming from the imperfectness of the individual transistors and switches, making it possible to realize a high-accuracy modulator.

Furthermore, since use of a rectangular wave as a carrier wave enables the transistors to function as switches, the modulator can be composed of switches only, with the result that the effect of the nonlinearity of the transistor can be minimized, making it possible to construct a higher-accuracy modulator.

A fourteenth embodiment where the present invention is applied to a speaker system will be explained with reference to FIG. 33.

Many groups of speakers SP are arranged. The individual speakers SP are connected in place of D/A converters shown in the eighth embodiment, whereby the input signal in the eighth embodiment is converted into an audio signal. A selection device of the invention is used to select the speakers SP according to the input signal to the D/A converter and drives them by using a signal of 0 or a signal of 1 or −1. This enables the speakers to be driven only by the switches. Therefore, the deterioration resulting from the performance of the amplifier, which was found in conventional analog amplifiers, can be reduced.

Figure 34:
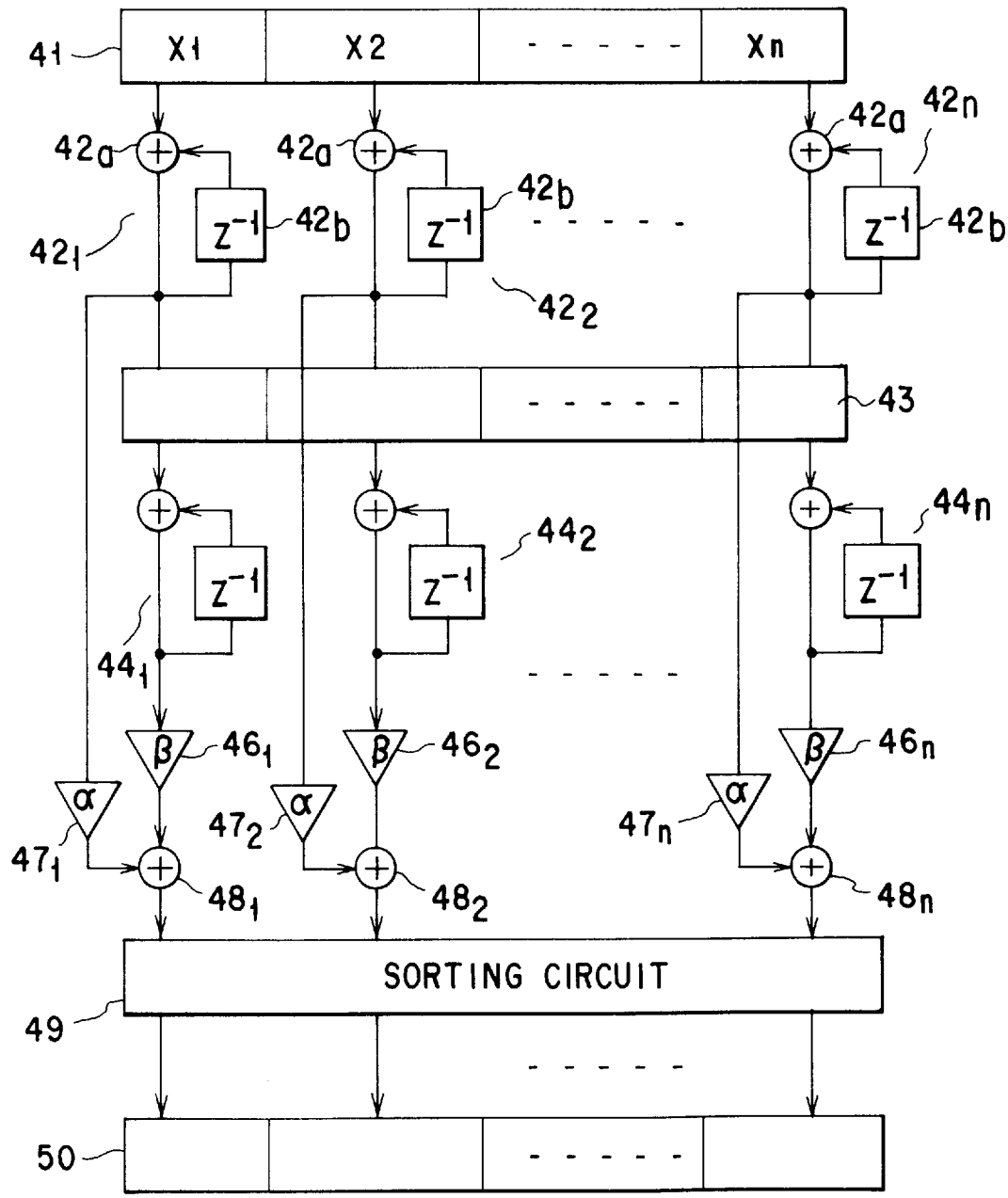
FIG. 34 is a block diagram of a selection device according to a 20th embodiment of the present invention.

FIG. 34 shows a selection device according to a concrete example of the present invention. According to the selection device, a register 41 for holding a select signal including a plurality of signal components X1 to Xn is connected to a register 43 via integrators each comprising an adder 42a and a delay element 42b. The register 43 holds an integration value of each of the selection signal components X1 to Xn. The output terminals of the register 43 are connected to the coefficient multipliers $46_1$ to $46_n$ via integrators $44_1$ to $44_n$, respectively. The output terminals of coefficient multipliers $46_1$ and the output terminals of coefficient multipliers $47_1$ to $47_n$ whose input terminals are connected to the integrators $42_1$ to $42_n$ are connected to adders $48_1$ to $48_n$, respectively. In other words, the coefficient multipliers $46_1$ to $46_n$ multiplies the integrated accumulation signals from the integrators $42_1$ to $42_n$ with coefficients β, respectively, and the coefficient multipliers $47_1$ to $47_n$ multiplies the integrated selection signals from the integrators $42_1$ to $42_n$ with coefficient α. The output signals from the coefficient multipliers $46_1$ to $46_n$ and $47_1$ to $47_n$ are added by the adders $48_1$ to $48_n$, respectively. The addition result signals from the adders $48_1$ to $48_n$ are input to a sorting circuit 49. This sorting circuit 49 sorts the addition result signals in accordance with a descending order and permits the selection signal components corresponding to the used times of each current cell during a predetermined time period to hold in a register 50. The register 50 transfers the select signal having the selection signal components to the D/A converter and the register 41. At this time, the register 41 is updated to the new selection signal from the register 50.

There will now be described a transmitter provided with an internal D/A converter using the selection device of the present invention.

According to the transmitter shown in FIG. 35, the received signal input via an antenna 61 is input to a bandpass filter 62, whereby the signal outside the signal band is attenuated. The output signal from the bandpass filter is amplified by a linear amplifier (LNA) 63 whose output signal is input to mixers $65_1$ and $65_2$ via a bandpass filter 64. In the mixers $65_1$ and $65_2$, the received signal is frequency-converted by the local frequency signal from the local oscillator 69 and the π/π phase-shifted local frequency signal from a π/π phase shifter 68. The frequency-converted received signals from the mixers $65_1$ and $65_2$ are input to lowpass filters $66_1$ and $66_2$, respectively, and subjected to a channel selection. The channel-selected received signals are input to A/D converters (ADC) $67_1$ and $67_2$, respectively, to be converted to digital signals. The digital signals from A/D converters $67_1$ and $67_2$ are input to a demodulator 70 to be demodulated.

The A/D converters $67_1$ and $67_2$ each comprises a ΔΣ type A/D converter having two stage integrators $31_1$ and $31_2$ and an internal D/A converter 36 in which the selection device of the present invention shown in FIGS. 1 and 2 is used. In this embodiment, a multi-bit D/A converter is used as the internal D/A converter in order to expand the dynamic range of the A/D converter. When the multi-bit D/A converter is used, the non-linearity of the D/A converter 36 determines the A/D conversion characteristic of the whole of the A/D converter shown in FIG. 28. Therefore, the internal D/A converter 36 needs a high accuracy. In this embodiment, the D/A conversion circuit of the D/A converter 36 has a circuit having switches selectively controlled by the selection device shown in FIGS. 1 and 2, as shown in FIGS. 3 and 4. In the conversion circuit of FIG. 5, the current cells $22_1$ to $22_n$ are selected by the selection device so that the number of the selected current cells is determined by the input signal. In this case, the addition signal larger or smaller than the input reference signal in level is selected from among the addition signals from the adder 18, so that the current cells $22_1$ to $22_n$ are uniformly selected in accordance with the selected addition signal. Accordingly, the noise produced due to the variations of the elements in the specific frequency band can be decreased.

As described above, when the selection device shown in FIGS. 1 and 2 is used in the internal D/A converter of the A/D converter, a high accuracy A/D converter is realized even if the elements constructing the internal D/A converter are not uniform in characteristics. Accordingly, the A/D converter having a wide dynamic range is obtained in easy, so that no automatic gain controller (AGC) is required and thus the cost is reduced. If the A/D converter utilizing the present invention provides no desired dynamic range, an AGC may be connected to the pre-stage of the A/D converter. In this case, since the dynamic range of the A/D converter is largely expanded, the variable gain width of the AGC may be small.

In the embodiment, since the lowpass filters $66_1$ and $66_2$ are used for channel selection, a sharp cut-off characteristic is required for the lowpass filters. Since the A/D converter 18, however, can have a wide dynamic range, the lowpass filers $66_1$ and $66_2$ can comprise an anti-aliasing filter having a gentle cut-off characteristic and the channel selection can be performed by the digital demodulator 70.

Although the lowpass filters $66_1$ and $66_2$ are required to be lower in distortion, they can be constituted only by passive elements capable of being assembled in an IC device in a case of using a gentle cut-off characteristic filter. For this reason, the low-distortion lowpass filter can be easily realized.

FIG. 36 shows a transmitter applying the present invention. According to the transmitter, the input speech signal from a sound source, e.g., microphone 82 is digitally coded by a codec 81, and mapped to I and Q quadrature signals by a serial-to-parallel converter 80. The I and Q quadrature signals are converted to analog signals by D/A converters (DAC) $79_1$ and $79_2$. The analog signals are quadrature-modulated by a quadrature modulator comprising an adder 75, multipliers $76_1$, $76_2$, a local oscillator 77 and π/2 phase shifter 78. The quadrature-modulated signal is passed through a bandpass filter 74 so that undesired frequency signal components are attenuated, and then are amplified by a power amplifier (PA) 73 and input to a bandpass filter 72. The amplified signal is passed through a bandpass filter 72 so that undesired frequency components are attenuated and then transmitted via an antenna 71.

The transmitter includes the D/A converters $79_1$ and $79_2$ each comprising the selection device shown in FIGS. 1 and 2 and the D/A conversion circuit shown in FIGS. 3 and 4. Accordingly, even if the D/A converters $79_1$ and $79_2$ are constructed by elements which are not uniform in characteristics, the transmitter having good modulation accuracy is realized.

Figure 38:
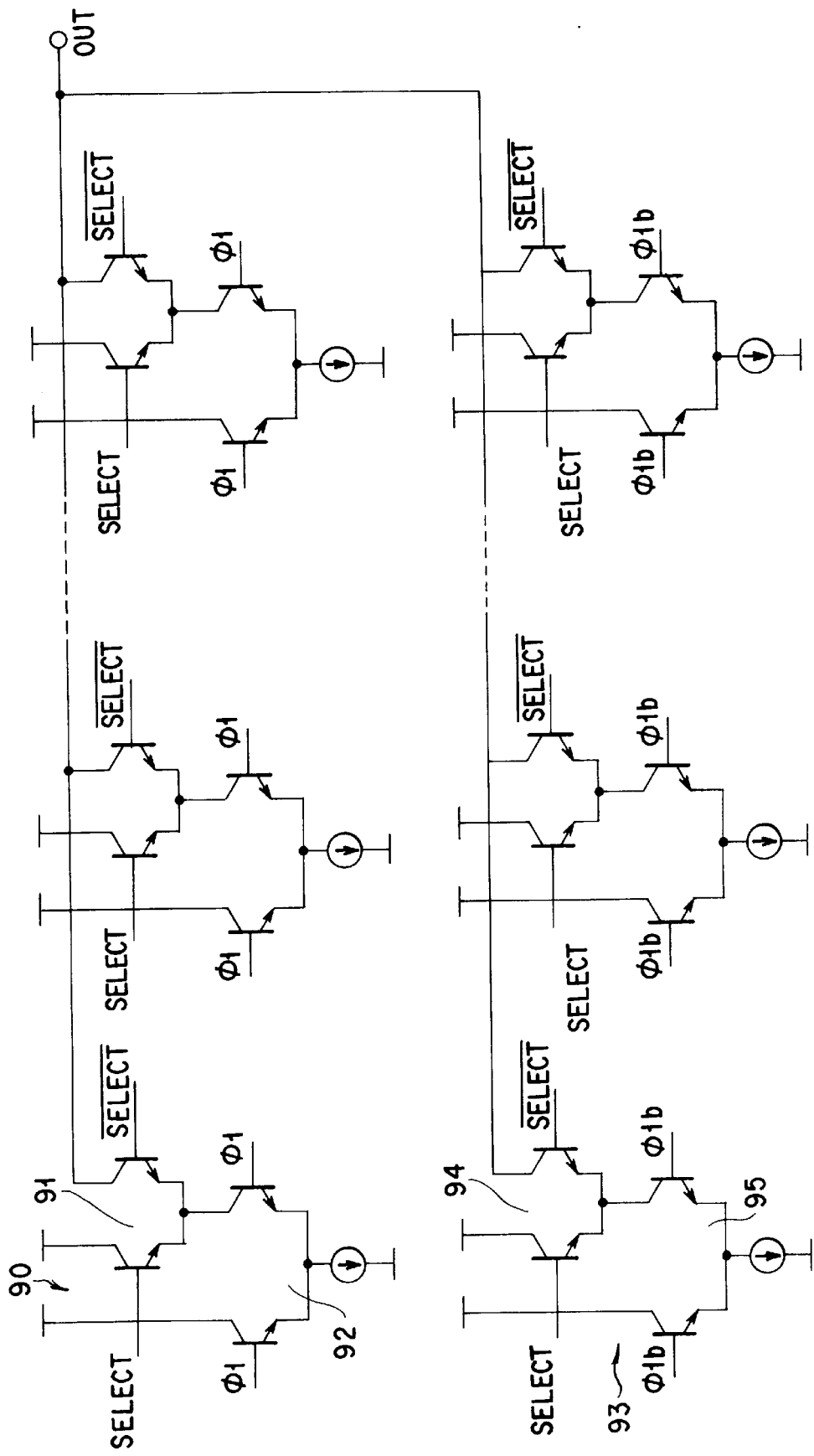
FIG. 38 is a circuit diagram of the quadrature modulator used in the transmitter of FIG. 37.

FIG. 37 shows a transmitter using a quadrature modulator (QMOD) 83 constructed as shown in FIG. 38. That is, the quadrature modulator 83 comprises a plurality of transistor circuits 90 and 93 connected to an output terminal OUT. The transistor circuit 90 comprises a pair of transistors 91 having emitters connected to each other and a pair of transistors 92 having emitters connected to each other, the collector of one of the transistors 92 being connected to the emitters of the transistors 91. The transistor circuit 93 comprises a pair of transistors 94 having emitters connected to each other and a pair of transistors 95 having emitters connected to each other, the collector of one of the transistors 95 being connected to the emitters of the transistors 94.

In the above quadrature modulator 83, the bases of the transistors 91 and 94 are supplied with a select signal "select" and an inverse select signal "$\overline{\text{select}}$" output from the select device shown in FIGS. 1 and 2. The bases of the transistors 92 and 95 are supplied with local frequency signals φ, $\overline{\phi}$ and φ 1b, $\overline{\phi}$ 1b. If the select signals are input to the bases of the transistors 91 and 94 and the local frequency signals are supplied to the bases of the transistors 92 and 95, the current cells Ii are selected. As a result, the amplitude of the output signal is modulated in accordance with the number of selected cells.

FIG. 39 shows a signal generator for generating the local frequency signals φ, $\overline{\phi}$ and φ 1b, $\overline{\phi}$ 1b. The signal generator comprises an local oscillator 101 for generating a local frequency signal φ, an inverter for inverting the local frequency signal φ to output the inverted local frequency signal $\bar{\phi}$, a π/2 phase shifter 103 for phase-shifting the local frequency signal φ by π/2 to output the signal φ 1b, and an inverter for inverting the signal φ 1b to output the inverted signal $\bar{\phi}$ 1b.

As described above, the transistors 95 are supplied with the π/2-shifted local frequency signal, so that an amplitude-modulated current output is obtained at the output terminal OUT. If a voltage output is required, it is obtained by connecting a resistor to the output terminal OUT.

In the embodiment, the amplitude of the output signal is determined by the number of current cells selected by the select signal "select" which is generated by the selection device shown in FIGS. 1 and 2. Therefore, it is suppressed in a specific frequency band similarly to the receiver that the operation of the transmitter is influenced by the error based on the transistor size. For this reason, even if the elements of poor accuracy are used in the quadrature modulator, the digital conversion and frequency conversion can be performed with good accuracy. Accordingly, the high accuracy D/A converter and quadrature modulator which are required in conventional transmitters are not required in the present transmitter. Furthermore, processes using high accuracy elements are not required, so that cost is decreased.

As described above, use of the invention can reduce the effect of the analog element accuracy on the conversion accuracy, making it possible to achieve high-accuracy conversion without increasing the operation speed. Because the accuracy of element need not be high, an expensive process or trimming is not required, enabling cost reduction and miniaturization. Furthermore, the decrease of the operation speed makes the power consumption lower.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

I claim:

1. A selection device comprising:

integrating means for integrating data representing a state in which each of selectable objects having relative error between them is used during a predetermined period; and selection means for selecting the selectable objects in accordance with an integration result of said integrating means and an input signal.

2. The selection device according to claim 1, which comprises a table including data representing times by which each of the selectable objects is used during a predetermined period, and said integrating means integrates, one or more times, data representing the used times of each of the selectable objects which is stored in said table.

3. A digital/analog converter comprising:

a plurality of current cells to be selectively connected in parallel;

a plurality of switches for selecting the current cells to be connected in parallel;

table means having a selection state of each of said current cells;

integrating means for integrating, one or more times, data representing the selection state of each of said current cells which is stored in said table means; and selecting means for selectively closing said switches in accordance with an integration result of said integrating means and an input signal.

4. The converter according to claim 3, wherein said current cells comprise a plurality of capacitors to be selectively connected in parallel and selected by said switches.

5. The converter according to claim 3, further comprising adding means selectively connected to said current cells by said switches to add currents supplied selectively from said current cells.

6. A selection device comprising:

filter means including:

a plurality of selectable objects to which a selection signal is input to output delay signals of the selection signal;

a plurality of coefficient multipliers connected to said selectable objects, respectively, for multiplying the delay signals with coefficient to output weighted signals;

feedback means for feeding back the weighted signals from said coefficient multipliers; and feedforward means for feeding forward the weighted signals from said coefficient multipliers; and selection means for selecting said selectable objects in accordance with an output from said filter means.

7. The selection device according to claim 6, wherein said filter means has a transfer zero arranged other than a DC point.

8. A selection device comprising:

an integrator for integrating, one or more times, data representing a state in which each of selectable objects having relative error is used during a predetermined period;

an adder for adding a dither signal to an input signal; and a selector for selecting said selectable objects in accordance with an integration result of said integrator and an addition result of said adder.

9. A ΔΣ modulator comprising:

feedback means including at least one integrator, quantizer and coefficient multiplier;

an integrator for integrating data representing a state in which each of selectable objects is used during a predetermined period;

a multi-bit type internal D/A converter having a selector for selecting said selectable objects in accordance with at least one of an integration result of said integrator and an input signal.

10. A ΔΣ modulator comprising:

a cascade ΔΣ type modulator including a plurality of ΔΣ modulators connected in a cascade form and having feedback means with at least one first integrator, quantizer and coefficient multiplier;

a second integrator connected to said cascade ΔΣ modulator, for integrating data representing a state in which each of selectable objects is used during a predetermined period; and a multi-bit internal D/A converter including a selector for selecting said selectable objects in accordance with at least one of an integration result of said integrator and an input signal.

11. A modulator comprising:

a plurality of reproducers for reproducing carrier waves;

a switch circuit for selecting outputs of said reproducers;

an integrator for integrating one or more times data representing a state in which each of said reproducers is used during a predetermined period; and a selector for driving said switch circuit to select said reproducers according to the integration result of said integrator and an input signal.

12. An electroacoustic transducing apparatus comprising:

a plurality of speakers;

a switch circuit for selecting outputs of said speakers;

an integrator for integrating, one or more times, data representing a state in which each of said speakers is used during a predetermined period; and a selector for driving said switch circuit to select said speakers according to at least one of an integration result of said integrator and an input signal.

13. A radio apparatus comprising:

frequency conversion means for frequency-converting a received signal;

a A/D converter for A/D-converting a frequency-converted signal from said frequency conversion means to output a digital signal; and a demodulator for demodulating the digital signal from said A/D converter, wherein said A/D converter comprises:
   a plurality of current cells to be selectively connected in parallel;
   a plurality of switches for selecting the current cells;
   an integrator for integrating, one or more times, data representing the number of times by which each of said current cells is selected during a predetermined period; and
   selecting means for selectively closing said switches in accordance with an integration result of said integrating means and the received signal.

14. A radio apparatus comprising:

a D/A converter for converting an input signal to an analog signal;

a quadrature modulator for quadrature-modulating the analog signal to output a quadrature-modulated signal; and a transmission circuit for converting the quadrature-modulated signal in a transmission signal and transmitting it, wherein said D/A converter comprises:
   a plurality of current cells to be selectively connected in parallel;
   a plurality of switches for selecting the current cells;
   an integrator for integrating, one or more times, data representing the number of times by which each of said current cells is selected during a predetermined period; and
   selecting means for selectively closing said switches in accordance with an integration result of said integrating means and the received signal.

15. A radio apparatus comprising:

a signal source for generating a digital signal;

transmission means for converting the digital signal to a transmission signal and transmitting it, wherein said transmission means comprises:
   a plurality of switches for selecting a plurality of current cells;
   an integrator for integrating data representing times which each of said current cells is selected during a predetermined period;
   a selector for selectively driving said switches in accordance with a local oscillation signal selected by an input signal and an integration result of said integrator.

16. A selection apparatus for integrating, one or more times, data representing the use/non-use of each of selectable objects of having relative errors between them, dividing the selectable objects into groups, integrating, one or more times, data representing the use/non-use of each of the groups, and selecting the selectable objects in accordance with the integration results.

* * * * *